(12) United States Patent
Eno et al.

(10) Patent No.: US 8,144,311 B2
(45) Date of Patent: Mar. 27, 2012

(54) LASER APPARATUS AND DISTANCE MEASUREMENT APPARATUS

(75) Inventors: Taizo Eno, Tokyo (JP); Masayuki Momiuchi, Tokyo (JP)

(73) Assignee: Kabushiki Kaisha Topcon, Tokyo (JP)

( * ) Notice: Subject to any disclaimer, the term of this patent is extended or adjusted under 35 U.S.C. 154(b) by 251 days.

(21) Appl. No.: 12/570,353

(22) Filed: Sep. 30, 2009

(65) Prior Publication Data

US 2010/0079744 A1    Apr. 1, 2010

(30) Foreign Application Priority Data

Oct. 1, 2008 (JP) ................. 2008-256425

(51) Int. Cl.
*G01C 3/08* (2006.01)
(52) U.S. Cl. ........ 356/4.01; 356/3.01; 356/3.1; 356/4.1; 356/5.01; 356/5.1
(58) Field of Classification Search ......... 356/3.01–28.5
See application file for complete search history.

(56) References Cited

U.S. PATENT DOCUMENTS

| | | |
|---|---|---|
| 5,568,308 A | 10/1996 | Harada |
| 2009/0052288 A1 | 2/2009 | Eno et al. |

FOREIGN PATENT DOCUMENTS

| | | | |
|---|---|---|---|
| JP | 06-242478 | * | 2/1994 |
| JP | 06-242478 | | 9/1994 |
| JP | 09-211512 A | | 8/1997 |
| JP | 09-318743 A | | 12/1997 |
| JP | 2003-304019 | * | 10/2003 |
| JP | 2003-304019 A | | 10/2003 |
| JP | 2008-249658 A | | 10/2008 |

* cited by examiner

*Primary Examiner* — Thomas Tarcza
*Assistant Examiner* — Luke Ratcliffe
(74) *Attorney, Agent, or Firm* — Brinks, Hofer, Gilson & Lione

(57) ABSTRACT

A technique for selecting two or more wavelengths of output light by a simpler structure is provided. A laser apparatus includes a laser oscillation portion for oscillating laser light; a nonlinear crystal inputting the laser light from the laser oscillation portion as a fundamental wave, the nonlinear crystal converting the fundamental wave into a second harmonic wave and changing conversion efficiency according to a temperature thereof, the nonlinear crystal having a periodically poled structure; and a ratio control means for controlling a ratio of the fundamental wave and the second harmonic wave outputting from the nonlinear crystal by controlling the temperature of the nonlinear crystal.

4 Claims, 14 Drawing Sheets

LASER APPARATUS AND DISTANCE MEASUREMENT APPARATUS

RELATED APPLICATIONS

This application claims priority under 35 U.S.C. §119 to Japanese Patent Application No. JP2008-256425 filed on Oct. 1, 2008, the entire content of which is hereby incorporated by reference.

BACKGROUND OF THE INVENTION

1. Field of the Invention

The present invention relates to a laser apparatus that can output laser light of two different wavelengths, and the present invention relates to a distance measurement apparatus having the laser apparatus.

2. Description of Related Art

In techniques for measuring a distance by laser light, a technique using laser light having two different wavelengths is known. As a means for obtaining laser light having two different wavelengths, a technique generating a harmonic wave from a fundamental wave by a nonlinear crystal is known. As the nonlinear crystal, a nonlinear crystal having a periodically poled structure is disclosed in Japanese Unexamined Patent Application Publication No. 9-211512.

SUMMARY OF THE INVENTION

In order to select laser light having two different wavelengths, a structure switching an optical system or an oscillation system have been used. However, the structures in these methods are complex.

An object of the present invention is to provide a technique for selecting two or more wavelengths of output light using a simpler structure in the composition generating laser light having two or more kind of wavelengths.

The present invention is a laser apparatus including a laser oscillation portion for oscillating laser light; a nonlinear crystal for inputting the laser light from the laser oscillation portion as a fundamental wave, the nonlinear crystal converting the fundamental wave into a second harmonic wave and changing conversion efficiency according to a temperature thereof, the nonlinear crystal having a periodically poled structure; and a ratio controller for controlling a ratio of the fundamental wave and the second harmonic wave outputting from the nonlinear crystal by controlling the temperature of the nonlinear crystal.

The present invention uses temperature dependence of conversion efficiency (the fundamental wave to the second harmonic wave) by the nonlinear crystal having a periodically poled structure. This is a phenomenon in which the ratio of the fundamental wave and the second harmonic wave changes greatly according to the temperature thereof. That is, according to the temperature control of the nonlinear crystal in the present invention, a ratio of the second harmonic wave is the maximum at a certain temperature, and the second harmonic wave is mainly output. Moreover, a ratio of the second harmonic wave is the minimum at a certain temperature, and the fundamental wave is mainly output. Furthermore, the present invention uses the phenomenon that a ratio of the fundamental wave and the second harmonic wave changes greatly according to the temperature. The ratio of the fundamental wave and the second harmonic wave can be optionally controlled by the temperature control.

According to the present invention, a mechanical switching structure is not necessary and the structure is simple in comparison with the case of adopting the mechanical switching structure because it only has to control the temperature of the nonlinear crystal. Therefore, the present invention is advantageous in cost, reliability, durability, and the miniaturization.

As the nonlinear crystal having a periodically poled structure, a wavelength conversion element of quasi-phase matching (QPM element) can be used. For example, PPLN (Periodically Poled $LiNbO_3$), PPSLT (Periodically Poled Stoichiometric $LiTaO_3$), PPKTP (Periodically Poled KTP ($KTiOPO_4$)) can be used. The nonlinear crystal having a periodically poled structure is disclosed in Japanese Unexamined Patent Application Publication No. 6-242478, Japanese Unexamined Patent Application Publication No. 9-211512, and Japanese Unexamined Patent Application Publication No. 2003-304019. As this nonlinear crystal having a periodically poled structure, a commodity marketed as an element (QPM/SHG element) for obtaining a second harmonic wave from a fundamental wave can be used.

The temperature control portion controls the temperature of the nonlinear crystal. The temperature control is performed by a heating means such as a heater and a cooling means such as a Peltier element. This temperature control is performed based on the predetermined temperature dependence of the conversion efficiency of the fundamental wave to the second harmonic wave.

The ratio of the fundamental wave and the second harmonic wave is not limited. However, actually, it is difficult to completely lose the output of the fundamental wave in practical use. Therefore, if the purity of the selected wavelength is required, it is preferable to improve the purity of the selected wavelength by a wavelength-selecting device (an optical filter).

A second aspect of the present invention is a distance measurement apparatus that includes an outputting portion for outputting output light of the laser apparatus according to claim 1 to an object to be measured; a receiving portion for receiving reflection light reflected by the object; and a signal processing portion for calculating a distance to the object by an output signal of the receiving portion. According to the second aspect, a distance measurement apparatus that can select the fundamental wave and the second harmonic wave can be provided.

A third aspect of the present invention is the distance measurement apparatus according to the second aspect, further including a selecting means for selecting the fundamental wave or the second harmonic wave; wherein the outputting portion outputs the fundamental wave or the second harmonic wave selected by the selecting means. According to the third aspect, the fundamental wave or the second harmonic wave can be selected as measurement light emitted to the object. For example, if a long distance is measured, long wavelength light having higher output strength than the second harmonic wave can be selected. If accuracy over a short distance is required, short wavelength light measurable at high accuracy can be selected.

A fourth aspect of the present invention is the distance measurement apparatus according to the second aspect, wherein the outputting portion outputs the fundamental wave and the second harmonic wave at the same time, and the receiving portion has a first receiving portion for receiving reflection light of the fundamental wave and a second receiving portion for receiving reflection light of the second harmonic wave, and the signal processing portion selects the output signal of the first receiving portion or the second receiving portion in accordance with a predetermined condition and calculates a distance to the object. According to the fourth aspect, the fundamental wave and the second harmonic wave are output to the object at the same time, and either wave can be used for the measurement according to the circumstances.

According to the present invention, the wavelength of output light can be selected in a simpler structure that generates two or more kinds of wavelengths.

DETAILED DESCRIPTION OF THE PREFERRED EMBODIMENTS

1. First Embodiment

Composition of Laser Apparatus

Figure 1:
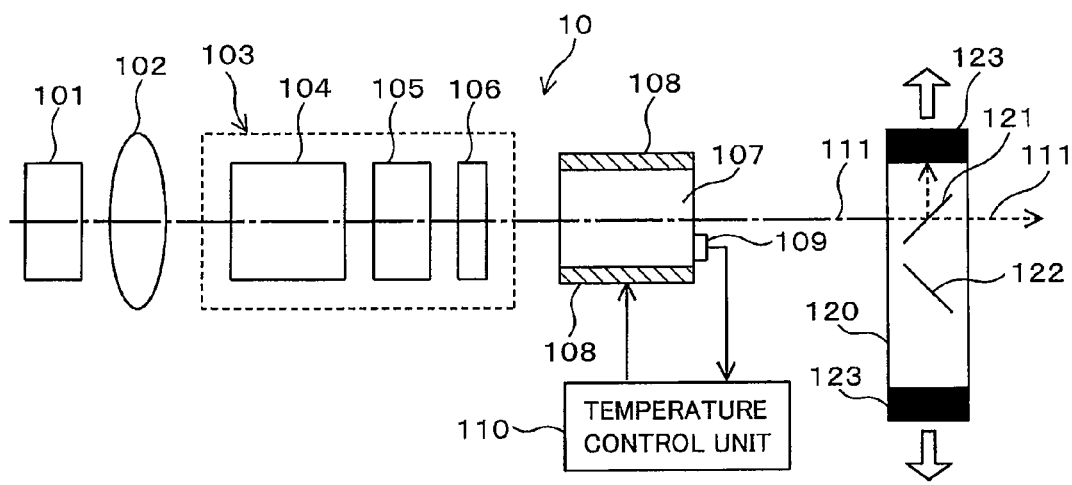
FIG. 1 is a schematic view showing an outline of a laser apparatus of the present invention.

An example of a laser apparatus of the present invention will be described hereinafter. The laser apparatus shown in this embodiment has a function for outputting pulse laser light having different wavelengths. FIG. 1 is a schematic view showing an example of the laser apparatus of the present invention.

FIG. 1 shows a laser apparatus 10 generating pulse laser light by Q-switching. The laser apparatus 10 has a semiconductor laser device 101, a collecting lens 102, a laser oscillator 103, a nonlinear crystal 107, and a wavelength selecting device 120.

The semiconductor laser device 101 generates laser light having a wavelength of 808 nm for excitation, which is an origin of laser light output from the laser apparatus 10. In this embodiment, a semiconductor laser element is used as the semiconductor laser device 101. The collecting lens 102 collects the laser light output from the semiconductor laser device 101. The collected laser light enters into the laser oscillator 103.

The laser oscillator 103 oscillates laser light by using the laser light that the semiconductor laser device 101 generates. The laser oscillator 103 has a laser medium 104, a saturable absorber 105, and an output mirror 106 therein. The input side of the laser medium 104 is coated so as to be a mirror plane. This mirror plane allows light having a wavelength of 808 nm to pass through and reflects light having a wavelength of 1064 nm going from the inside to outside. The laser medium 104 is a medium for amplifying laser light, and Nd (neodymium)-doped YAG crystal (yttrium aluminum garnet crystal) is used as the laser medium 104. Yb (Ytterbium) can be also used as a doping material in the laser medium. Moreover, a fiber can also be used as a laser medium instead of the crystal.

The saturable absorber 105 acts as a Q-switch, and the absorption coefficient of laser light has nonlinearity. Cr (chrome)-doped YAG crystal is used as the saturable absorber 105. The saturable absorber 105 has an optical characteristic that the permeability of laser light is rapidly increased when it absorbs the laser light to some degree. The laser light can be intermittently output by this characteristic. The output mirror 106 reflects 90% of the laser light and allows 10% of the laser light to pass through. The length between the mirror plane formed at the input side of the laser medium 104 and the output mirror 106 is set so as to be a cavity for generating a standing wave having a wavelength of 1064 nm. The compositions using an electro-optical method and an acousto-optical method can also be adopted as the Q-switch.

The nonlinear crystal 107 generates a harmonic wave (in this case, a second harmonic wave) of laser light (a fundamental wave having a wavelength of 1064 nm) amplified by the laser oscillator 103. The nonlinear crystal 107 has an optical nonlinearity and generates the harmonic wave of laser light entering therein. In this example, the nonlinear crystal 107 changes conversion efficiency of the harmonic wave in accordance with the temperature and has a periodically poled structure and acts as a wavelength conversion element of quasi-phase matching (QPM element). In this embodiment, MgO:PPSLT (MgO doped Periodically-Poled Stoichiometric $LiTaO_3$) is used as the nonlinear crystal 107. When laser light having a wavelength of 1064 nm enters into the nonlinear crystal 107, at least one of the laser light (fundamental wave) having a wavelength of 1064 nm and the laser light (second harmonic wave) having a wavelength of 532 nm is output from the nonlinear crystal 107.

Figure 2:
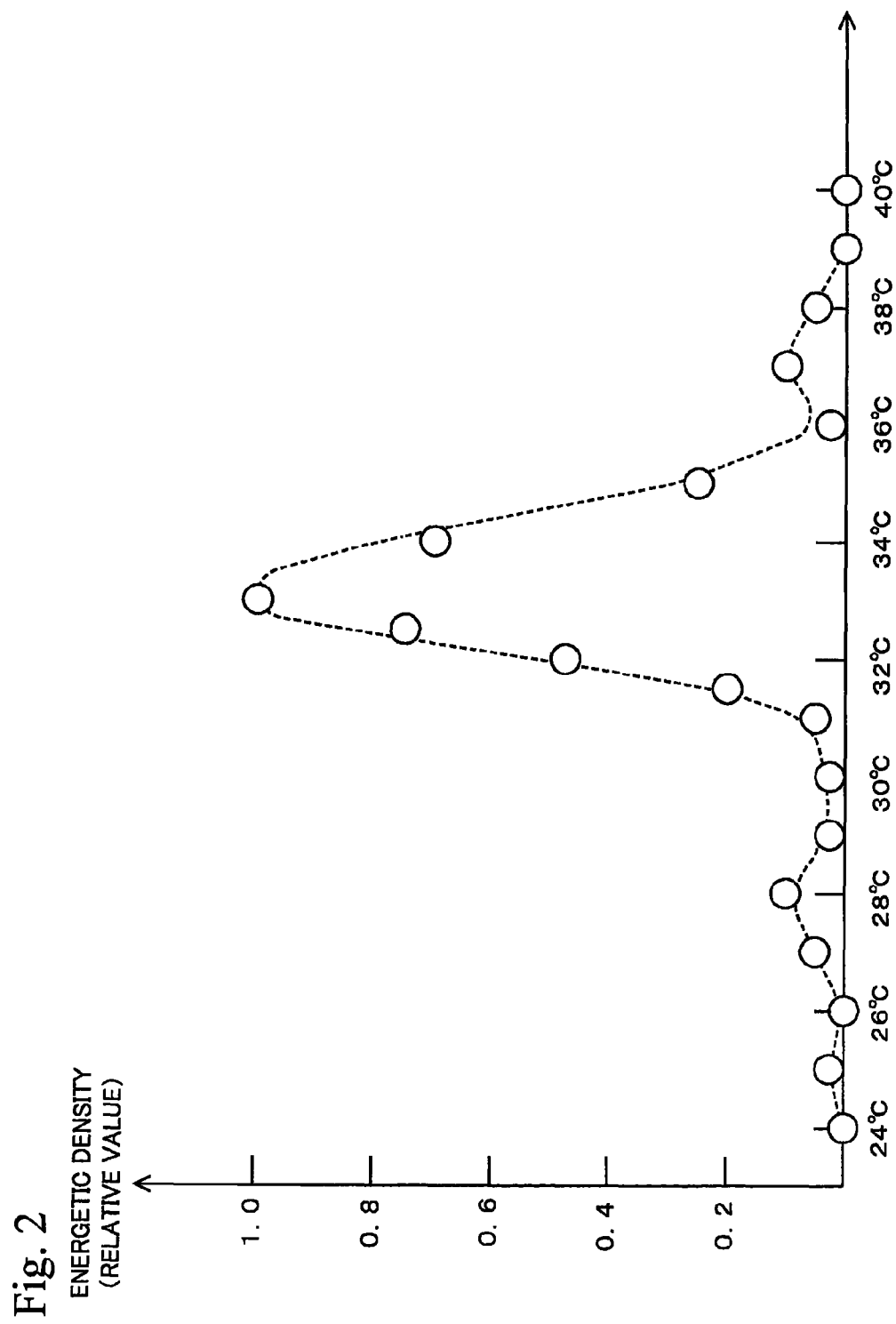
FIG. 2 is a graph showing temperature dependence of a second harmonic wave output from a nonlinear crystal into which a fundamental wave enters.

FIG. 2 is a graph showing temperature dependence of a second harmonic wave having a wavelength of 532 nm output from a nonlinear crystal into which a fundamental wave having a wavelength of 1064 nm enters. The horizontal axis in FIG. 2 is the temperature of the nonlinear crystal 107, and the vertical axis in FIG. 2 is a relative value of the strength of the output light (energetic density). The relative strength value is standardized so that the maximum strength of the output light is 1.

As shown in FIG. 2, the nonlinear crystal 107 having a periodically poled structure has the temperature dependence of the conversion efficiency to the second harmonic wave. This temperature dependence is characteristic. The output level of the second harmonic wave is a peak at a certain temperature (in this case, 33° C.), and the output level of the fundamental wave decreases most. Moreover, the output level of the second harmonic wave decreases when the temperature shifts, and the output level of the fundamental wave not converted into the second harmonic wave increases. The output level of the second harmonic wave is approximated by the Gaussian distribution.

As shown in FIG. 1, in this embodiment, a heating and cooling device 108 controlling the temperature of the nonlinear crystal 107 is provided at the nonlinear crystal 107. The heating and cooling device 108 is a combination of an electric heater and a Peltier element and can control the temperature of the nonlinear crystal 107 with an accuracy of about 0.1° C. in the range of 20° C. to 40° C. A temperature sensor 109 for detecting the temperature of the nonlinear crystal 107 is provided at the nonlinear crystal 107. The output of the temperature sensor 109 is input to a temperature control unit 110.

The temperature control unit 110 inputs the temperature data of the nonlinear crystal 107 from the temperature sensor 109. Moreover, the temperature control unit 110 adjusts a voltage added to the electric heater of the heating and cooling device 108 and adjusts a voltage added to the Peltier element thereof. The temperature control unit 110 adjusts at least one of the heating function of the electric heater and the cooling function of the Peltier element in accordance with the output of the temperature sensor 109, and the temperature of the nonlinear crystal 107 is adjusted. That is, the temperature control unit 110 controls the heating and cooling device 108, and the temperature of the nonlinear crystal 107 is adjusted. This heating and cooling device 108 and the temperature control unit 110 are an example of a ratio controller for controlling a ratio of the fundamental wave and the harmonic wave.

In this embodiment, it is possible to select any one of
(1) output mode 1 for outputting the fundamental wave having a wavelength of 1064 nm,
(2) output mode 2 for outputting the second harmonic wave having a wavelength of 532 nm,
(3) output mode 3 for outputting the fundamental wave of 50% and the second harmonic wave of 50% at the same time.
Each mode is described hereinafter.

Output Mode 1

In the output mode 1, a temperature of the nonlinear crystal 107 is maintained at 24° C. That is, the temperature control unit 110 adjusts, in real time, the heating and cooling device 108 in accordance with the detected temperature of the temperature sensor 109 so that the temperature of the nonlinear crystal 107 is maintained at 24° C. In this case, as shown in FIG. 2, the conversion efficiency to the second harmonic wave is close to 0 versus the input of the fundamental wave having a wavelength of 1064 nm. Therefore, the fundamental wave having a wavelength of 1064 nm outputs from the nonlinear crystal 107 because the fundamental wave is not converted and passes through as it is.

Output Mode 2

In the output mode 2, the temperature of the nonlinear crystal 107 is maintained at 33° C. That is, the temperature control unit 110 adjusts in real time the heating and cooling device 108 in accordance with the detected temperature of the temperature sensor 109 so that the temperature of the nonlinear crystal 107 is maintained at 33° C. In this case, as shown in FIG. 2, a ratio of the fundamental wave decreases most because the conversion efficiency to the second harmonic wave is a peak against the input of the fundamental wave having a wavelength of 1064 nm. Therefore, when the output of the second harmonic wave is requested, the nonlinear crystal 107 is set to the temperature in which the conversion efficiency to the second harmonic wave is a peak.

Output Mode 3

In the output mode 3, the temperature of the nonlinear crystal 107 is maintained at the temperature at which the outputs of the fundamental wave and the second harmonic wave are almost equal. That is, the temperature control unit 110 adjusts in real time the heating and cooling device 108 in accordance with the detected temperature of the temperature sensor 109 so that the temperature at which the outputs of the fundamental wave and the second harmonic wave are almost equal is maintained.

In this embodiment, although the example in which the output of the fundamental wave is 50% and the output of the second harmonic wave is 50% is described, any ratio of the output strength can be adopted by the temperature control of the nonlinear crystal 107.

A wavelength selecting device 120 is provided at the output side (right side of FIG. 1) of the nonlinear crystal 107. The wavelength selecting device 120 has wavelength selection mirrors 121 and 122 and can move in the vertical direction in FIG. 1. This movement is performed by a driving mechanism (not shown in the figure) such as the pulse motor. The reference sign 123 is a light absorption material for absorbing the light reflected by the wavelength selection mirror 121 or 122. The wavelength selecting device 120 is an example of a selecting means for selecting the fundamental wave or the second harmonic wave.

When the output mode 1 is selected, the wavelength selection mirror 121 in the wavelength selecting device 120 is inserted on an optical axis 111 (condition of FIG. 1). In this case, the fundamental wave outputs in the right direction of FIG. 1. At this time, the wavelength selecting device 120 intercepts a slightly remaining second harmonic wave output from the nonlinear crystal 107 and improves the purity of the fundamental wave.

When the output mode 2 is selected, the wavelength selection mirror 122 in the wavelength selecting device 120 is inserted in the optical axis 111. In this case, the second harmonic wave outputs in the right direction of FIG. 1. At this time, the wavelength selecting device 120 intercepts an extra fundamental wave output from the nonlinear crystal 107 and improves the purity of the second harmonic wave.

When the output mode 3 is selected, the wavelength selection mirrors 121 and 122 in the wavelength selecting device 120 come off from the optical axis 111. In this case, the output light from the nonlinear crystal 107 passes through the wavelength selecting device 120, and the fundamental wave and the second harmonic wave output in the right direction of FIG. 1 at the same time.

Action of Laser Apparatus

When the semiconductor laser device 101 continuously oscillates the laser light having a wavelength of 808 nm (CW oscillation), this laser light is collected by the collecting lens 102 and enters into the laser oscillator 103. When the laser medium 104 is excited by incident light having a wavelength of 808 nm, it forms the population inversion and induces the emission of coherent laser light having a wavelength of 1064 nm ($\lambda_1$). When the saturable absorber 105 absorbs the laser light and is saturated, the saturable absorber 105 becomes transparent. The laser light having a wavelength of 1064 nm, which was induced by the population inversion, reflects and shuttles between the mirror plane (omission of the figure) and the output mirror 106. Then, a standing wave of large amplitude is rapidly generated, and Q-switched oscillation is performed. The laser light having a wavelength of 1064 nm (the fundamental wave) is emitted from the output mirror 106 in the right direction of FIG. 1.

Then, the laser oscillator 103 stops the laser oscillation and is excited again by the laser light having a wavelength of 808 nm from the semiconductor laser device 101. The laser medium 104 gradually forms the population inversion and induces the emission of a coherent laser light having a wavelength of 1064 nm ($\lambda_1$). When the saturable absorber 105 absorbs the laser light and is saturated, the saturable absorber 105 becomes transparent and Q-switched oscillation starts again. The pulse oscillation of the laser light (the fundamental wave) having a wavelength of 1064 nm ($\lambda_1$) is performed by periodically repeating this action.

The laser light (the fundamental wave) having a wavelength of 1064 nm from the output mirror 106 enters into the nonlinear crystal 107. In this case, any one pulse laser light of (1) the fundamental wave (1064 nm), (2) the second harmonic wave (532 nm), and (3) the mixture wave of the fundamental wave of 50% and the second harmonic wave of 50% is output from the nonlinear crystal 107 in the right direction of FIG. 1 by selection of any one above-mentioned output modes 1 to 3. The output light from the nonlinear crystal 107 enters into the wavelength selecting device 120, and the optical path corresponding to each mode is selected, and the output light is further output in the right direction of FIG. 1.

2. Second Embodiment

Composition of Distance Measurement Apparatus

Figure 3:
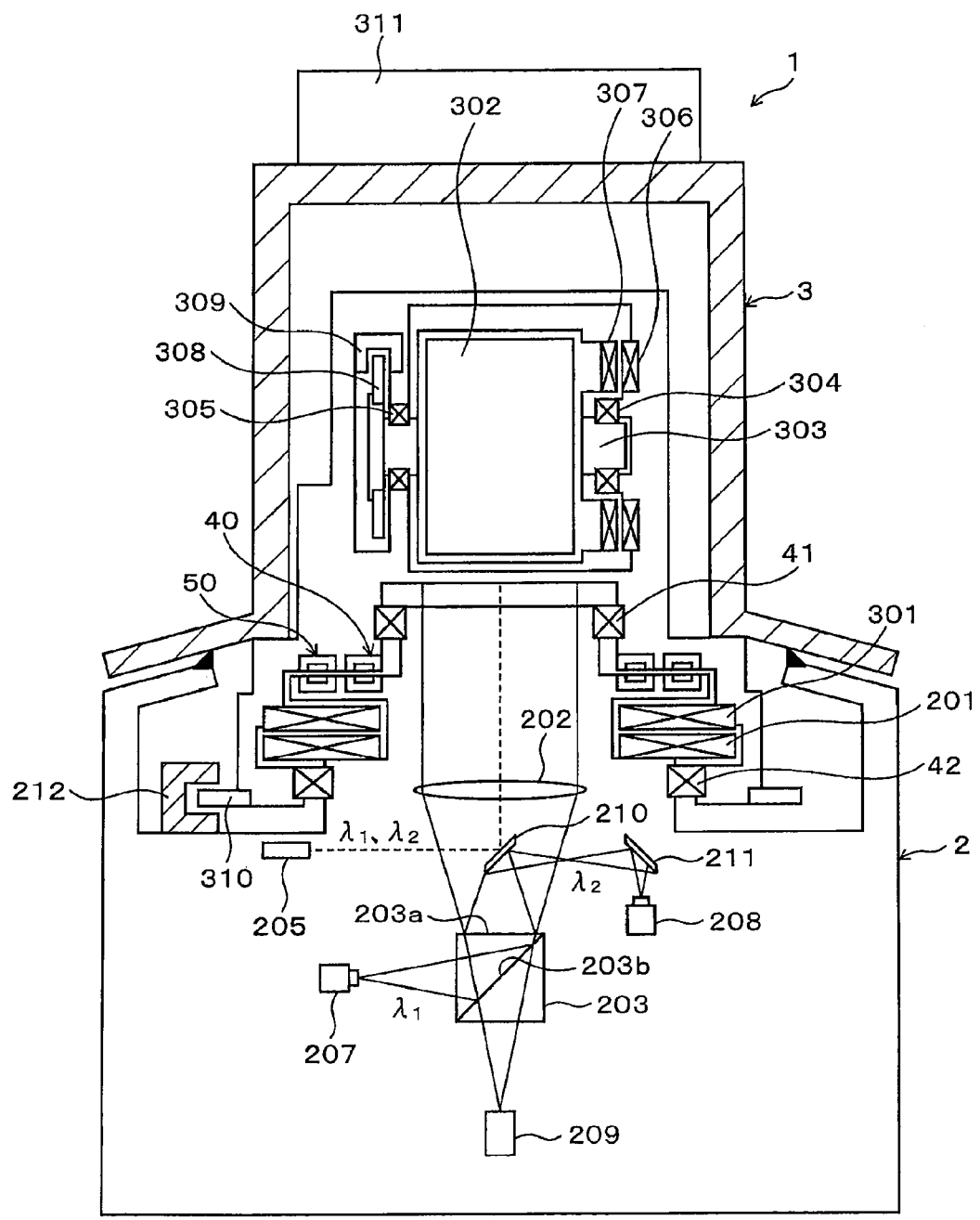
FIG. 3 is a schematic view showing an outline of a distance measurement apparatus of the present invention.

An example of a distance measurement apparatus of the present invention will be described hereinafter. FIG. 3 shows an example of a distance measurement apparatus of the present invention. In this embodiment, an apparatus that can select either the fundamental wave (long wavelength) or the second harmonic wave (short wavelength) as measurement light according to a predetermined condition will be described. The distance measurement apparatus uses the laser apparatus 10 described in the first embodiment as a measurement light source.

Outline

A distance measurement apparatus 1 is shown in FIG. 3. The distance measurement apparatus 1 has a main body 2 and a rotating optical portion 3 that is rotatable against this main body 2. The rotating optical portion 3 is provided so as to be rotatable against the main body 2 via bearings 41 and 42. The transmission of the data signal between the main body 2 and the rotating optical portion 3 and the electric power supply from the main body 2 to the rotating optical portion 3 are performed by a data transmission device 40 and an electric power transmission device 50. These transmission devices have coils at the main body 2 side and the rotating optical portion 3 side with centering the rotation axis, and both coils are disposed slightly away. According to this composition, the data signal and the electric power are transmitted by the electromagnetic induction between coils regardless of the rotation of the rotating optical portion 3.

Rotational Mechanism

A stator 201 is provided at the main body 2. This stator 201 has two or more magnetic poles on the circumference, and the coils are rolled on the magnetic poles. A rotor 301 is provided at the rotating optical portion 3 against the stator 201. The rotor 301 has two or more permanent magnets on the circumference. When the control circuit, which is not shown in the figure, switches the energizing to two or more magnetic poles of the stator 201, the rotation power of the rotor 301 against the stator 201 is generated. Then, the rotating optical portion 3 rotates against the main body 2. The stator 201 and the rotor 301 are composed of a DD motor (direct drive motor) using the principle of a brushless DC motor.

Composition of the Main Body 2

The composition of the main body 2 will be described hereinafter. The main body 2 has a collecting lens 202. An oblique reflection mirror 210 is provided at the back of the collecting lens 202 (lower side of FIG. 3). The two sides of the oblique reflection mirror 210 are reflection mirrors. A selection reflection mirror 203 is provided below the oblique reflection mirror 210. A reflection side 203a is provided at the upper surface of the selection reflection mirror 203. The reflection side 203a selectively reflects the light having a wavelength of 532 nm ($\lambda_2$) in the upper direction of FIG. 3 among the incident light entering from the upper direction of FIG. 3, and allow the light having other wavelengths to pass in the lower direction of FIG. 3. Moreover, the selection reflection mirror 203 has an oblique reflection side 203b. The oblique reflection side 203b selectively reflects the light having a wavelength of 1064 nm ($\lambda_1$) in the left direction of FIG. 3 and allows the light having other wavelengths to pass in the lower direction of FIG. 3.

A first light-receiving portion 207 detecting the light having a wavelength of 1064 nm ($\lambda_1$) is provided at the left side of the selection reflection mirror 203. Moreover, an oblique reflection mirror 211 is provided at the right side of the oblique reflection mirror 210. Furthermore, a second light-receiving portion 208 detecting the light having a wavelength of 532 nm ($\lambda_2$) is provided at the lower side of the oblique reflection mirror 210. The first light-receiving portion 207 and the second light-receiving portion 208 have a photodiode having sensitivity to the detected wavelength band and a peripheral circuit. A measurement light emitting portion 205 is provided at the left side of the oblique reflection mirror 210. The measurement light emitting portion 205 has the laser apparatus 10 shown in FIG. 1. A CCD camera 209 is provided below the selection reflection mirror 203. The CCD camera 209 photographs an image obtained by a rotating reflecting mirror 302 and outputs the image data.

According to the composition having the selection reflection mirror 203 mentioned above, the laser light (measurement light) having a wavelength of 1064 nm ($\lambda_1$) or 532 nm ($\lambda_2$) from the measurement light emitting portion 205 is reflected by the upper surface of the oblique reflection mirror 210 and enters into the lower side of the collecting lens 202. This laser light (measurement light) entering into the collecting lens 202 is reflected by the rotating reflecting mirror 302 and is emitted to the outside of the distance measurement apparatus 1. Thus, the measurement light emitting portion 205, the oblique reflection mirror 210, the collecting lens 202, and the rotating reflecting mirror 302 are an example of an outputting portion for outputting an output light of the laser apparatus 10.

Moreover, the light entering from the outside of the distance measurement apparatus 1 to the rotating reflecting mirror 302 is reflected by the lower side thereof and is collected by the collecting lens 202 and enters into the selection reflection mirror 203. The light (the second harmonic wave) having a wavelength of 532 nm ($\lambda_2$) among incident light to this selection reflection mirror 203 is selectively reflected by the reflection side 203a to the upper side, and the light having other wavelengths passes through the reflection side 203a. The light having a wavelength of 532 nm ($\lambda_2$) reflected by the reflection side 203a to the upper side is reflected by the lower side of the oblique reflection mirror 210 to the right side and is further reflected by the oblique reflection mirror 211 to the lower side and arrives at the second light-receiving portion 208.

On the other hand, the light (the fundamental wave) having a wavelength of 1064 nm ($\lambda_1$) among the light passing through the reflection side 203a is selectively reflected by the reflection side 203b to the left side and arrives at the first light-receiving portion 207. Moreover, the other light among the light passing through the reflection side 203a passes through the reflection side 203b and arrives at the CCD camera 209.

Thus, light having a wavelength of 1064 nm ($\lambda_1$) entering from the outside of the distance measurement apparatus 1 is detected in the first light-receiving portion 207, and light having a wavelength of 532 nm ($\lambda_2$) is detected in the second light-receiving portion 208, and light having other wavelengths is detected in the CCD camera 209. That is, the measurement light having two wavelengths can be individually detected, and at the same time, the CCD camera 209 photographs the image projected onto the rotating reflecting mirror 302.

The main body 2 has a rotary encoder for detecting a direction (a horizontal angle (an azimuth)) of the rotating optical portion 3. An angle reading portion 212 of the rotary encoder has a light emitting diode on the one wall of a C-shaped material and a phototransistor on the other wall. An angle read portion 310 passes through the walls of the C-shaped material. The pulsed light of the light emitting diode passes through slits of the angle read portion 310. The phototransistor outputs signals of angular information by detecting the pulsed light. The angle read portion 310 and the angle reading portion 212 measure an angle by the same principle as a conventional rotary encoder.

Composition of the Rotating Optical Portion 3

Next, the composition of the rotating optical portion 3 will be described. The rotating optical portion 3 has the rotor 301 at a position opposed to the stator 201 of the main body 2. The rotor 301 has two or more permanent magnets on the circumference. Moreover, the rotating optical portion 3 has the rotating reflecting mirror 302. The rotating reflecting mirror 302 is fixed so that it is possible to change an elevation angle against the rotating optical portion 3 by the elevation rotation axis 303. The elevation rotation axis 303 is supported to the rotating optical portion 3 by the bearings 304 and 305. Moreover, an open mouth, not shown in the figure, is provided in the front of the rotating reflecting mirror 302. The open mouth is a composition in which the light can be emitted to the outside and the light from the outside can enter. The elevation angle is an angle against a horizontal plane in an upper and lower direction.

A stator 306 is provided in the rotating optical portion 3. This stator 306 has two or more magnetic pole rolled coils on the circumference. A rotor 307 is provided at the side of rotating reflecting mirror 302 opposed to the stator 306. The rotor 307 has two or more permanent magnets on the circumference. The stator 306 and the rotor 307 are composed of a DD motor (direct drive motor) using the principle of a brushless DC motor. When the control circuit, not shown in the figure, switches the energizing to two or more magnetic poles of the stator 306, the rotation power of the rotor 307 against the stator 306 is generated. As a result, the elevation angle of the rotating reflecting mirror 302 can be controlled.

An angle read portion 308 is provided at the other end of the elevation rotation axis 303. Slits are formed in the circumference of the angle read portion 308. Moreover, the rotating optical portion 3 has an angle reading portion 309. The angle reading portion 309 has a light emitting diode on the one wall of C-shaped material and has a phototransistor on the other wall thereof. The angle read portion 308 passes through between walls of the C-shaped material. The pulsed light of the light emitting diode passes through slits of the angle read portion 308. The phototransistor outputs signals of angular information by detecting the pulsed light. The angle read portion 308 and the angle reading portion 309 detect an angle by the same principle as a conventional rotary encoder.

The angle read portion 310 is provided below the rotating optical portion 3. The angle read portion 310 is annular and has slits on the circumference. The angle read portion 310 passes through between walls of the C-shaped angle reading portion 212 when the rotating optical portion 3 rotates.

A sighting device 311 is provided at the upper side of the rotating optical portion 3. The sighting device 311 is an optical sighting device in which an operator of the distance measurement apparatus 1 takes aim at the measurement object (target). The basic structure of the sighting device 311 is a telescope having a display and a scale for sighting.

Composition of Control System

Figure 4:
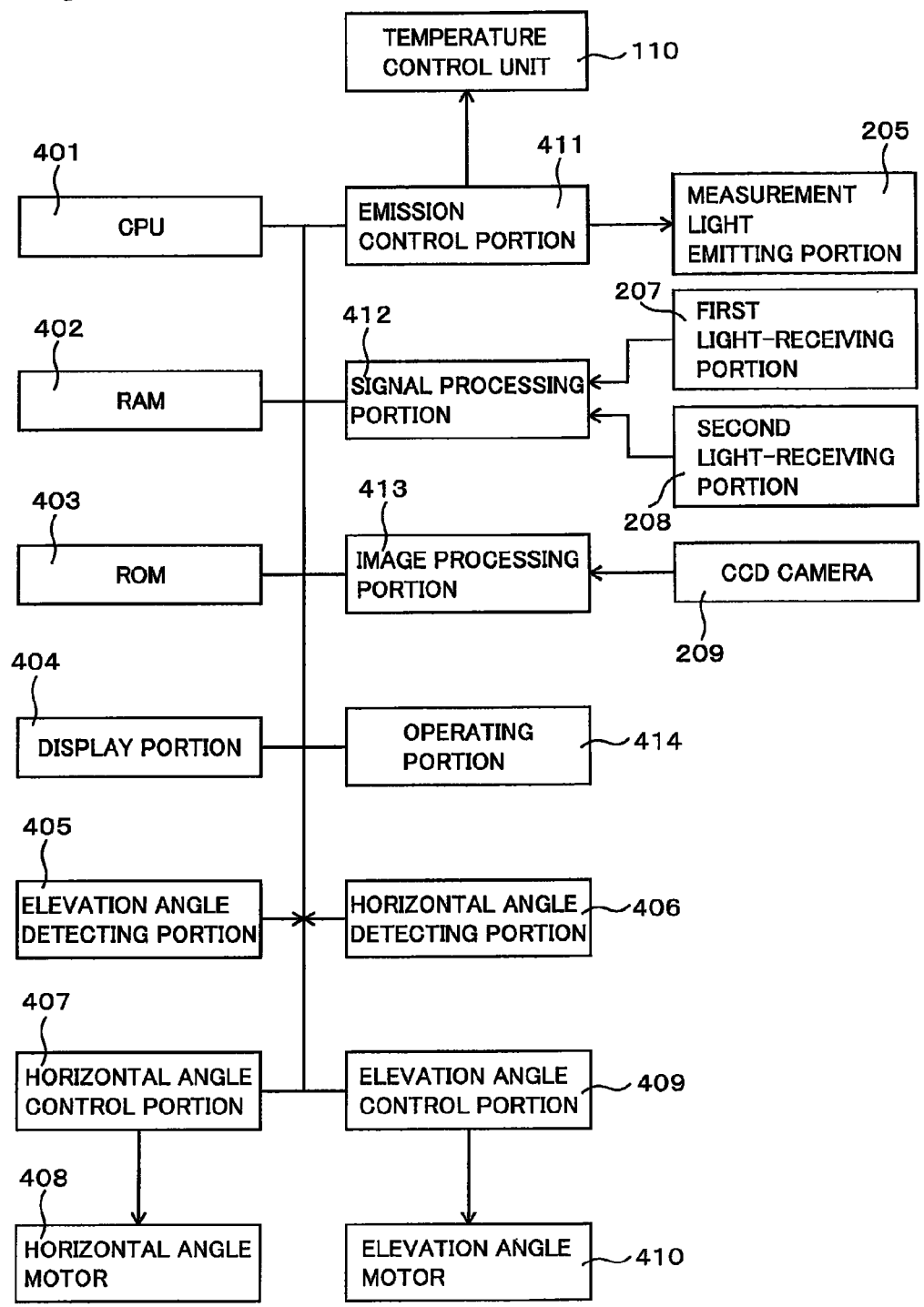
FIG. 4 is a block diagram showing a composition of a control system of the distance measurement apparatus.

Next, the composition of a control system of the distance measurement apparatus 1 will be described. FIG. 4 is a block diagram showing a composition of a control system of the distance measurement apparatus 1 shown in FIG. 3. The control system shown in FIG. 4 has a CPU 401, a RAM 402, a ROM 403, a display portion 404, an elevation angle detecting sensor 405, a horizontal angle detecting sensor 406, a horizontal angle control portion 407, a horizontal angle motor 408, an elevation angle control portion 409, an elevation angle motor 410, an emission control portion 411, a measurement light emitting portion 205, a signal processing portion 412, a first light-receiving portion 207, a second light-receiving portion 208, an image processing portion 413, a CCD camera 209, and an operating portion 414.

The CPU 401 controls the movement of the distance measurement apparatus 1 and calculates various processing. Specifically, the CPU 401 executes the procedures based on an action program mentioned below. When the CPU 401 executes various processing, the RAM 402 temporarily stores the program and data, etc. Moreover, the RAM 402 stores various conditions necessary for action and the measurement data, etc. The RAM 402 is composed of a semiconductor memory, a hard disk drive, etc. The RAM 402 is a nonvolatile memory and can store the data even if the main electrical power is turned off. The ROM 403 stores the action program executed by the CPU 401 and the condition necessary for action, etc.

The display portion 404 has a display (for example, a liquid crystal display). This display portion 404 displays an action status of the distance measurement apparatus 1, information necessary for the operation, and measured distance information, etc. The elevation angle detecting sensor 405 detects an elevation angle of the rotating reflecting mirror 302 (refer to FIG. 3). The elevation angle detecting sensor 405 is the angle reading portion 309 shown in FIG. 3. The horizontal angle detecting sensor 406 detects a horizontal angle (azimuth) in the rotating optical portion 3. The horizontal angle detecting sensor 406 is the angle reading portion 212 shown in FIG. 3.

The horizontal angle control portion 407 has a drive circuit for driving the horizontal angle motor 408 and a control circuit for controlling the drive circuit. The horizontal angle motor 408 is driven by the horizontal angle control portion 407 and rotates the rotating optical portion 3 (refer to FIG. 3) and controls the horizontal angle of the rotating optical portion 3. The horizontal angle motor 408 has a stator 201 and a rotor 301 shown in FIG. 3. The elevation angle control portion 409 has a drive circuit for driving the elevation angle motor 410 and a control circuit for controlling the drive circuit. The elevation angle motor 410 is driven by the elevation control portion 409 and controls the elevation angle of the rotating reflecting mirror 302. The elevation angle motor 410 has the stator 306 and the rotor 307 shown in FIG. 3.

The emission control portion 411 controls the emission timing of the measurement light emitting portion 205 (refer to FIG. 3). Moreover, the emission control portion 411 sends a control signal for deciding the wavelength of the laser light output from the measurement light emitting portion 205 (the laser apparatus 10 of FIG. 1) to the temperature control unit 110 of FIG. 1. The laser light outputting from the distance measurement apparatus 1 is selected by this control signal. That is, any one of the fundamental wave having a wavelength of 1064 nm ($\lambda_1$) (output mode 1), the second harmonic wave having a wavelength of 532 nm ($\lambda_2$) (output mode 2), or the laser light having both wavelengths output simultaneously (output mode 3) is selected. Moreover, a selection signal for selecting a wavelength in the wavelength selecting device 120 is output from the emission control portion 411 to the measurement light emitting portion 205 correspond to the above-mentioned each mode.

The signal processing portion 412 performs the processing described below based on the output of at least one of the first light-receiving portion 207 and the second light portion 208. The signal processing portion 412 outputs data necessary for calculating the distance to the object. The image processing portion 413 performs the image processing based on image data photographed by the CCD camera 209 (refer to FIG. 3). The operating portion 414 is a means for operating manually the distance measurement apparatus 1 (refer to FIG. 3) and has various switches for the operation.

Signal Processing Portion

Figure 5:
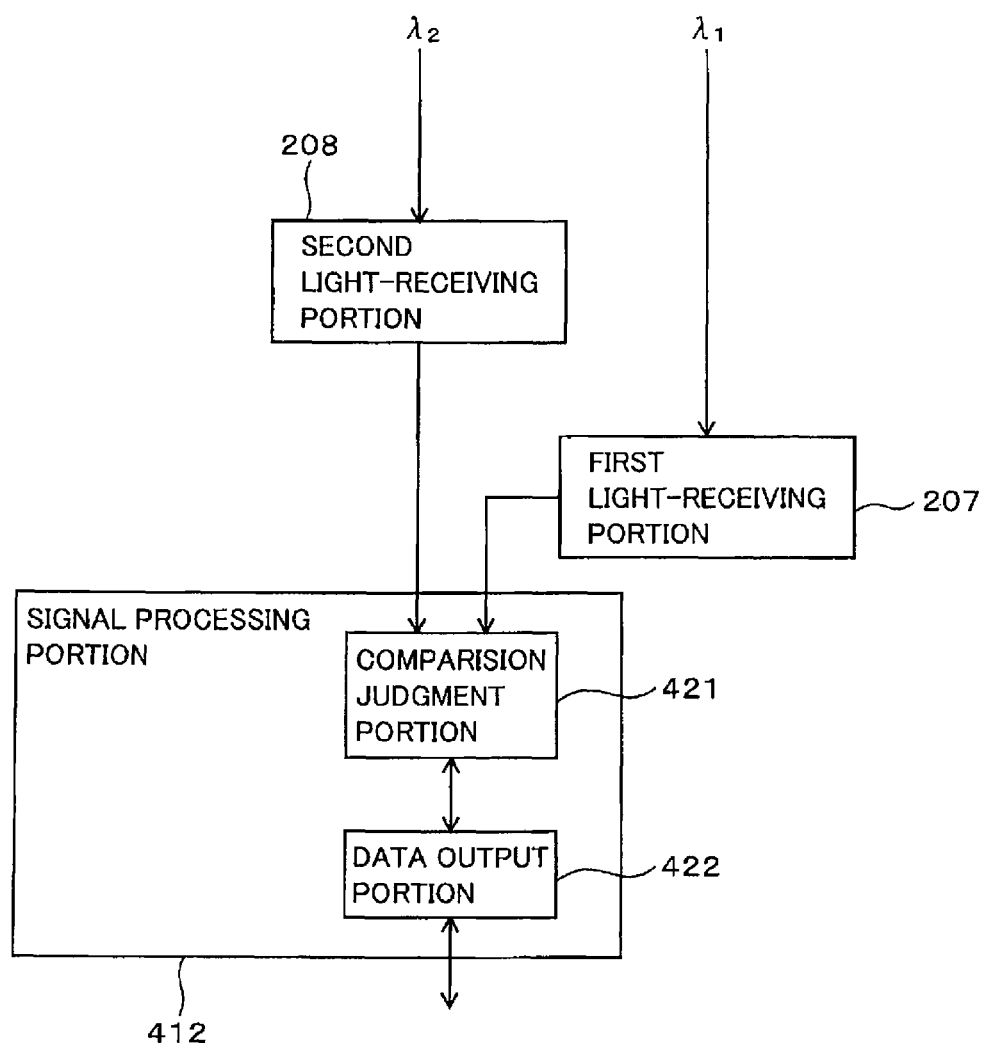
FIG. 5 is a schematic view showing a composition of a signal processing portion.

An example of the detailed composition of the signal processing portion 412 in FIG. 4 will be described hereinafter. FIG. 5 is a block diagram explaining functions of the signal processing portion. FIG. 5 conceptually shows the following condition. The measurement light (fundamental wave) having a wavelength of 1064 nm ($\lambda_1$) enters into the first light-receiving portion, and the measurement light (second harmonic wave) having a wavelength of 532 nm ($\lambda_2$) enters into the second light-receiving portion.

As shown in FIG. 5, the signal processing portion 412 has a comparison judgment portion 421 and a data output portion 422. The comparison judgment portion 421 compares outputs of the first light-receiving portion 207 and the second light-receiving portion 208. The comparison judging portion 421 judges which output is used for the distance calculation. The content of the judgment is described below. The data output portion 422 outputs the output of the first light-receiving portion 207 or the second light-receiving portion 208 to the outside of the signal processing portion 412 in accordance with the judgment result of the comparison judgment portion 421.

First Measurement Action

Figure 6:
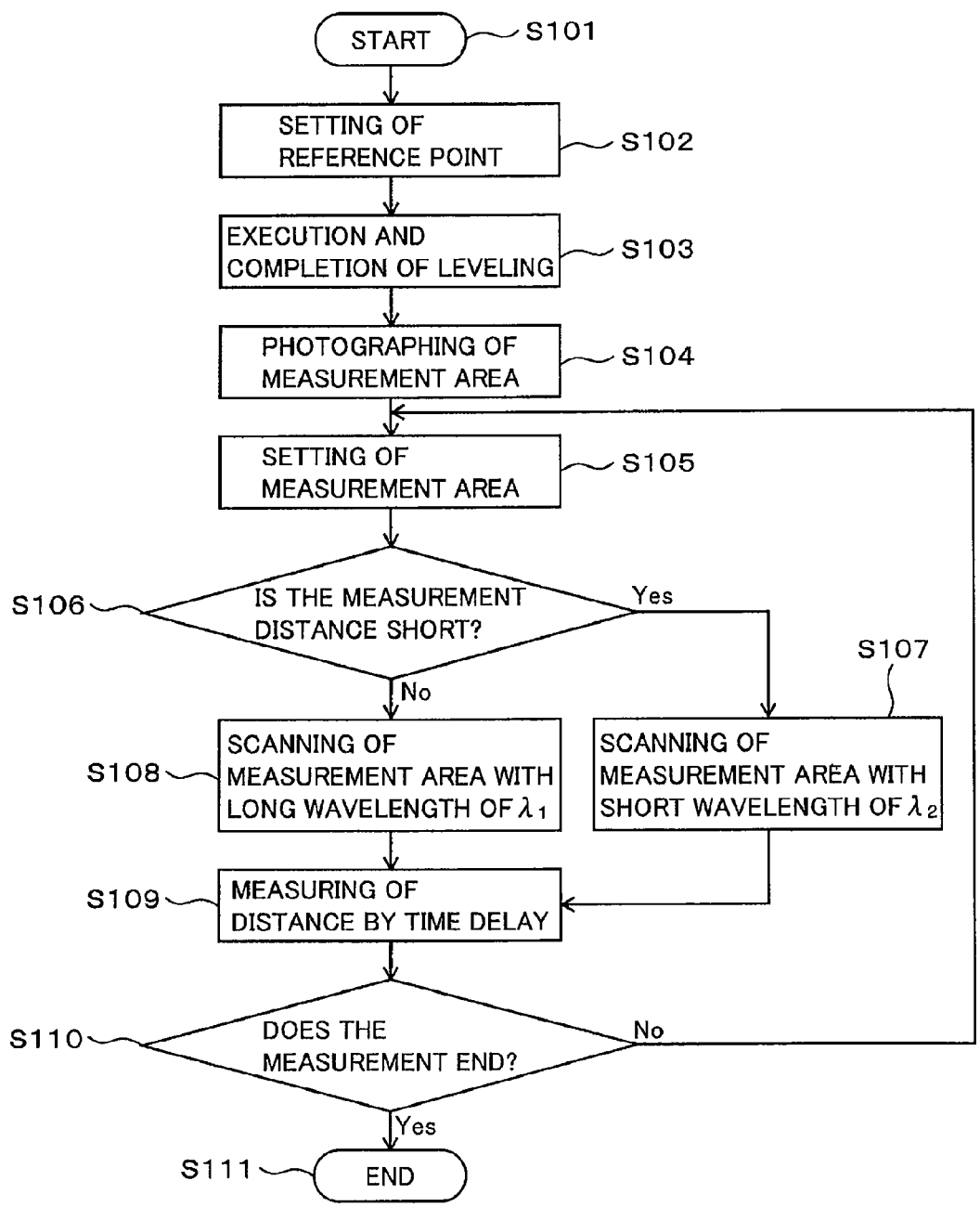
FIG. 6 is a flowchart showing an example of the procedure for measuring a distance.

An example of the action of the distance measurement apparatus 1 shown in FIG. 3 will be described hereinafter. Here, the action for selecting a wavelength of the measurement light emitted to the measurement object in accordance with the measurement distance will be described. FIG. 6 is a flowchart showing an example of the procedure for measuring the distance. In this case, the operating portion 414 (refer to FIG. 4) of the distance measurement apparatus 1 (refer to FIG. 3) has a setup key for setting two kinds of measurement areas of the long distance measurement area and the short distance measurement area manually. Moreover, an action program necessary to execute the following processing is stored in the ROM 403 shown in FIG. 4.

When the operating portion 414 (refer to FIG. 4) is operated and the processing of the distance measurement starts (Step 101), the above-mentioned action program stored in the ROM 403 is read to the RAM 402 and the following action is begun.

First, a processing for setting the reference point is performed (Step 102). In this processing, data of the reference point stored in the RAM 402 is read out. This data of the reference point is related to the distance data in the following processing, and final measurement data is obtained. When the distance measurement apparatus 1 is set up on the measurement site, this data of the reference point is input manually or by data transmission from a position-measuring instrument using GPS satellites.

After Step 102, the execution and completion of the leveling are performed (Step 103). In this processing, the horizontality and direction of the distance measurement apparatus 1 is adjusted. This processing is automatically performed based on the output of a leveling device and a direction sensor, not shown in the figure.

When the processing up to Step 103 ends, the display portion 404 in FIG. 4 displays the end information. Next, an operator of the distance measurement apparatus 1 takes aim at the measurement object by using the sighting device 311, and an approximate direction of the distance measurement apparatus 1 is decided. Then, the operating portion 414 in FIG. 4 is operated, and the CCD camera 209 (refer to FIG. 3) photographs the measurement area (Step 104). Moreover, the measurement area is set (Step 105).

Moreover, at that time, the operator operates the operating portion 414 and selects a short distance or a long distance of the measurement distance (Step 105). In this case, the operator measures a distance to the object by eye and judges whether the distance is a long distance suitable for the measurement light having a wavelength of 1064 nm or a short distance suitable for the measurement light having a wavelength of 532 nm.

Step 105 can be automatically processed. In this case, the image processing portion 413 (refer to FIG. 4) analyzes an image photographed in Step 104 and calculates an approximate distance to the object. The long distance measurement or the short distance measurement is selected based on this calculated value, and the selected content is stored in the RAM 402.

Next, in Step 105, the setting content of the distance to the object is read out, and whether the setting content is the short distance measurement or the long distance measurement is judged. Here, whether the measurement distance is short or not is judged (Step 106). If the measurement distance is short (that is, the short distance measurement is set), the processing in Step 107 is performed. Otherwise, the processing in Step 108 is performed.

In Step 107, the measurement area is scanned by using the pulse laser light having a short wavelength (532 nm=$\lambda_2$) (second harmonic wave). In Step 107, the laser apparatus 10 in FIG. 1 having the measurement light emitting portion 205 shown in FIGS. 3 and 4 acts in the output mode 2, and the pulse laser light having a wavelength of 532 nm ($\lambda_2$) is output. This pulse laser light is output from the measurement light emitting portion 205 shown in FIG. 3 and is reflected to the upper side in FIG. 3 by the oblique reflection mirror 210 and is emitted to the measurement area through the collecting lens 202 and the rotating reflecting mirror 302.

In this case, the measurement light is emitted to each measurement point (each object) while scanning one by one two or more measurement points that are set in the measurement area. For example, m×n pieces (m and n are natural numbers not including 0) of measurement points are set to the measurement area like a lattice. The horizontal angle of the rotating optical portion 3 and the elevation angle of the rotating reflecting mirror 302 are controlled one by one corresponding to the pulsed oscillation so as to emit one or more of the laser pulses to each measurement point.

When the processing in Step 107 is not performed and the processing in Step 108 is performed, the laser apparatus 10 in FIG. 1 having the measurement light emitting portion 205 outputs the pulse laser light having a wavelength of 1064 nm ($\lambda_1$) (fundamental wave). In this case, the laser apparatus 10 in FIG. 1 acts in the output mode 1. This pulse laser light is output from the measurement light emitting portion 205 shown in FIG. 3 and is reflected to the upper side in FIG. 3 by the selection reflection mirror 203 and is emitted to the object via the collecting lens 202 and the rotating reflecting mirror 302. In this case, scanning control similar to that in Step 106 is performed.

In Steps 107 or 108, the pulse laser light used for the measurement is emitted to the object with one or more times of the pulse. The reflected measurement light reflected by the object comes back to the distance measurement apparatus 1. The reflected light is received in the first light-receiving portion 207 or the second light-receiving portion 208 in accordance with the wavelength. That is, if the measurement light emitted to the object is the pulse laser light having a wavelength of 1064 nm ($\lambda_1$), the reflected light is received in the first light-receiving portion 207. Moreover, if the measurement light emitted to the object is the pulse laser light having a wavelength of 532 nm ($\lambda_2$), the reflected light is received in the second light-receiving portion 208.

The distance to the object is calculated (measured) by measuring the time delay of the reflected light corresponding to the emission timing of the measurement light in Steps 107 or 108 (Step 109).

The processing in Step 109 mainly referring to the block diagram of FIG. 4 will be described hereinafter. First, a signal of the oscillation timing of the laser pulse is output from the emission control portion 411. Moreover, the signal of the receiving timing of the reflected light is output from the signal processing portion 412. When the laser pulse shuttles between the distance measurement apparatus 1 and the object, the time (travelling period) corresponding to the distance to the object is required. Therefore, the receiving timing of the reflected light contains a time delay in accordance with the distance to the object from the emission timing of the laser pulse used for the measurement. Therefore, the CPU 401 calculates a travelling period by comparing the above-mentioned two signals and calculates a distance from the distance measurement apparatus 1 to the object in accordance with the travelling period and a speed of light. The distance measurement in Step 109 is performed by this principle.

This distance calculation is processed when the measurement light scans each measurement object (each measurement point) that is set in the measurement area at a predetermined density. Usually, measurement points are set like a lattice in the measurement area and are scanned one by one. As a result, the distance data group in the measurement area is obtained.

The distance data group (list of three-dimensional data) in the measurement area is obtained by the processing up to Step 109. This distance data group is related to the image data photographed in Step 104 and the other data, etc. This distance data group is stored in the RAM 402 (refer to FIG. 4). Moreover, the display portion 405 (refer to FIG. 4) displays the measured distance information.

If the measurement ends, the processing proceeds from Step 110 to Step 111 and ends. Otherwise, the processing returns to Step 105, and the processing after Step 105 is executed again.

Feature of the First Measurement Action

According to the above-mentioned first measurement action, the wavelength of the measurement light is selected manually in accordance with the relative largeness or smallness of the measurement distance (far or near). That is, when the distance to the object is great, the laser light having a wavelength of 1064 nm (fundamental wave) that is advantageous for the long distance propagation is selected. When the distance to the object is short, the laser light having a wavelength of 532 nm (second harmonic wave) with high measurement resolution is selected, although it would be disadvantageous for long distance propagation.

Second Measurement Action

Figure 7:
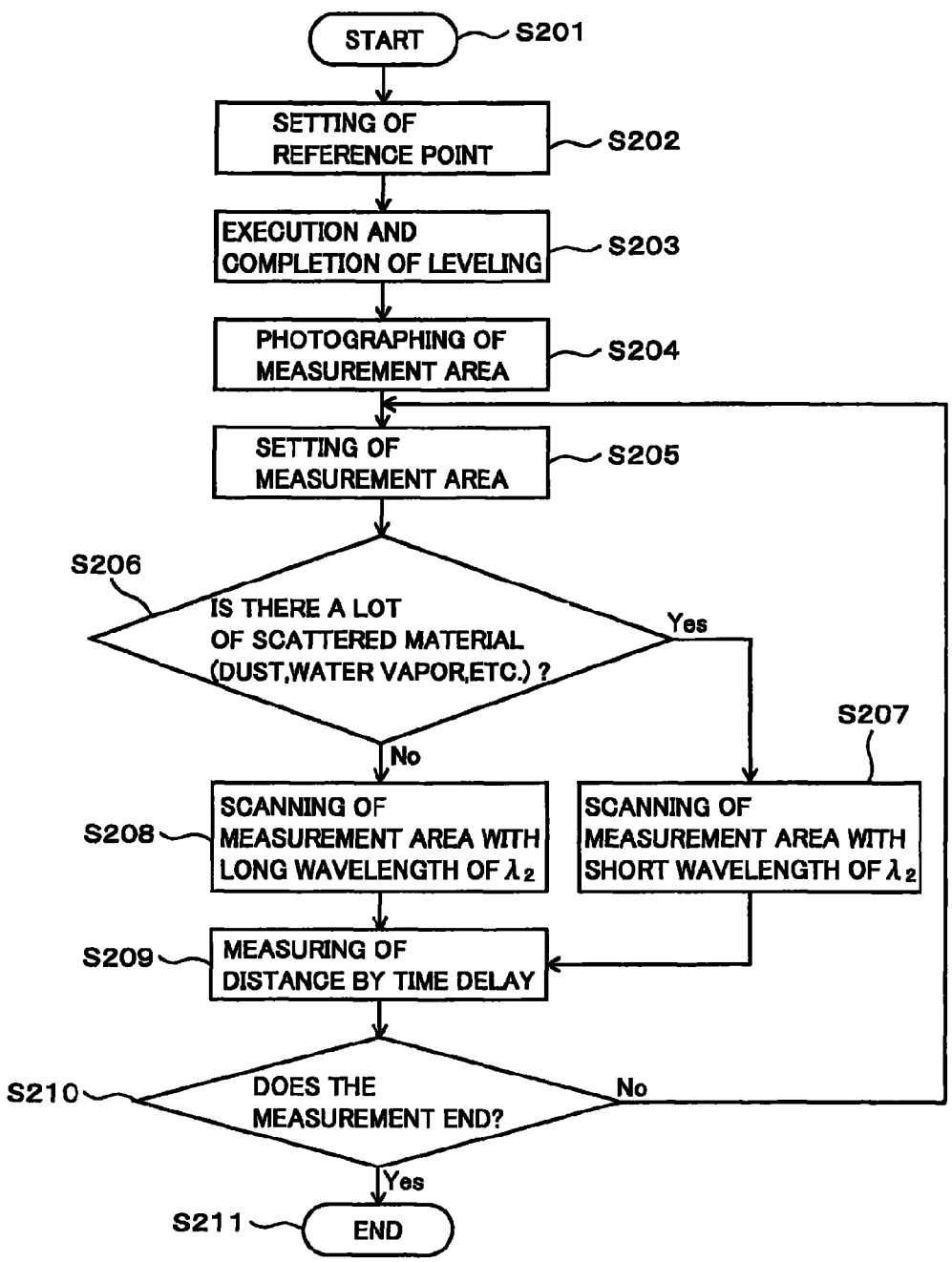
FIG. 7 is a flowchart showing an example of the procedure for measuring a distance.

An example of the action of selecting a wavelength of the measurement light according to the transparency degree of air in the measurement environment will be described hereinafter. FIG. 7 is a flowchart showing an example of the procedure for measuring a distance. The start processing (Step 201) to Step 203 is the same as Step 101 to Step 103 in FIG. 6. After Step 203, the measurement area is photographed (Step 204) and the measurement area is set (Step 205).

Next, the photographed image in Step 204 is analyzed by the image processing portion 413 in FIG. 4, and the transparency degrees in the measurement environment (transparency degree of air) is calculated. The decentralized values of dust, water vapor, etc., are calculated based on this transparency degree, and the effects of dust, water vapor, etc., are measured. The amount of scattered materials is judged based on this measurement result (Step 206). If there is a lot of scattered material, the measurement area is scanned with long wavelength $\lambda_1$ (Step 207). If there is not a lot of scattered material, the measurement area is scanned with short wavelength $\lambda_2$ (Step 208). The standard of the judgment in Step 206 is experimentally obtained beforehand.

Since the processing after Step 209 is the same as the processing after Step 109 in FIG. 6, repeated explanation is omitted here. Moreover, the operator can judge the transparency degree of the measurement environment and can input the judgment result in Step 206 to the apparatus manually.

Feature of the Second Measurement Action

According to the above-mentioned second measurement action, the wavelength of the measurement light is selected according to the transparency degree of air in the measurement environment. That is, when the transparency degree of air is high, the scattering of light is a slight. Therefore, the short wavelength light of 532 nm ($\lambda_2$) that can measure with high resolution, although weak in output intensity, is selected. In this case, the measurement can be performed with high resolution.

On the other hand, when the transparency degree of the measurement environment is low, the long wavelength light of 1064 nm ($\lambda_1$) with strong output intensity is selected. In this case, although the measurement resolution is sacrificed, the measurement can be performed even if the transparency degree is low.

Thus, the wavelength of the measurement light is selected according to the transparency degree of the measurement environment. Therefore, even if the measurement environment is inferior (the transparency degree of the measurement environment is low), the measurement can be performed. Moreover, when the measurement environment is good, the measurement can be performed with high resolution.

The Third Measurement Action

Figure 8:
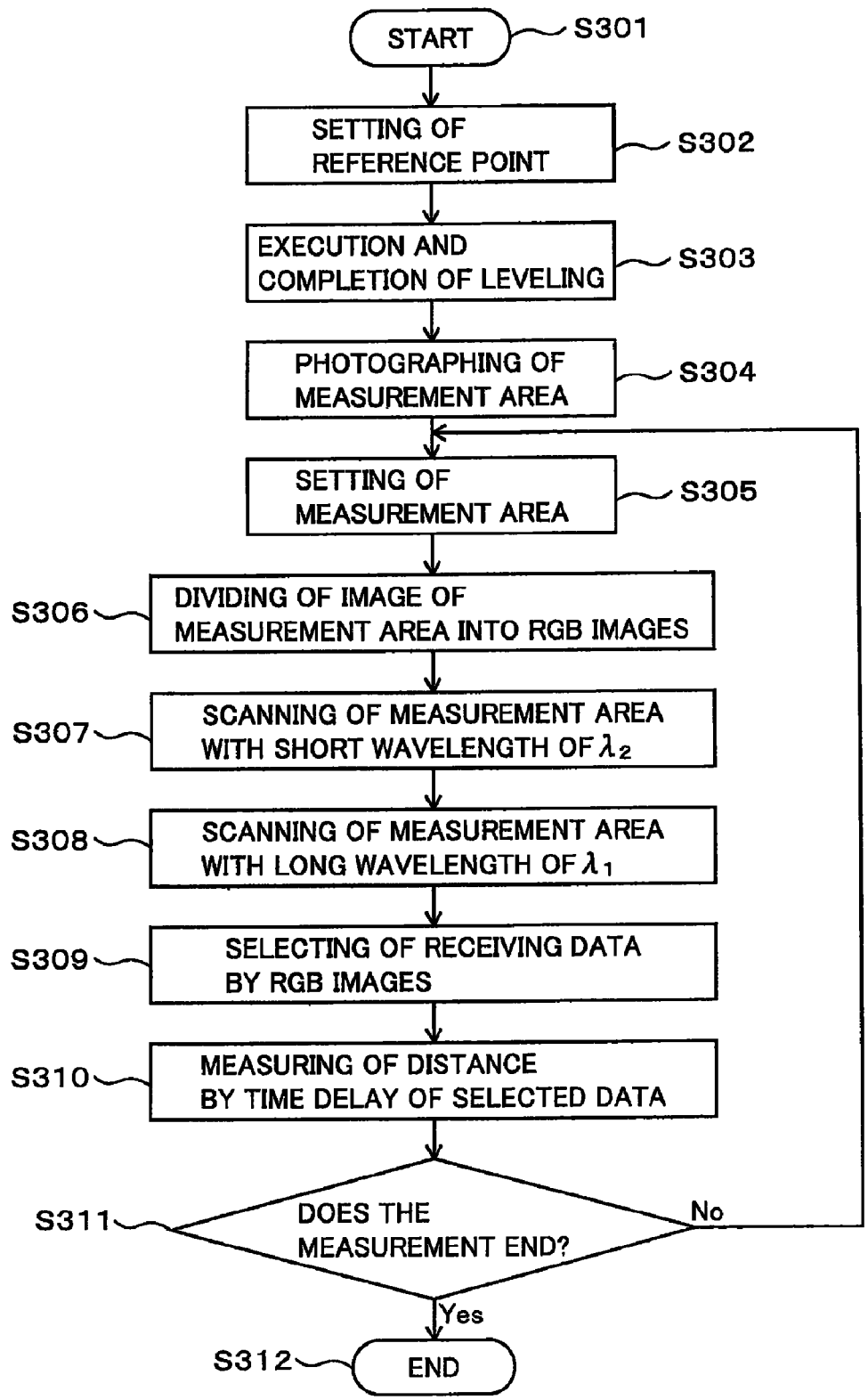
FIG. 8 is a flowchart showing an example of the procedure for measuring a distance.

An example of the action of selecting the wavelength of measurement light according to the color of the measurement object will be described hereinafter. FIG. 8 is a flowchart showing an example of the procedure for measuring a distance. The start processing (Step 301) to Step 305 is the same as Step 201 to Step 205 in FIG. 7.

After Step 305, the image processing portion 413 processes the image photographed in Step 304 and divides the image of the measurement area into three images in the colors RGB (Step 306). The RGB images are stored in the RAM 402 shown in FIG. 4.

Next, the measurement area is scanned by the measurement light having a short wavelength of 532 nm ($\lambda_2$) (Step 307). In this case, the data of each measurement point is related to the coordinate data of each measurement point and is obtained and is stored in the RAM 402 shown in FIG. 4. The calculation for measuring a distance is not performed at this step. The data of output timing of the laser pulse from the emission control portion 411 and the data of receiving timing of the laser pulse from the signal processing portion 412 are stored in the RAM 402 as it is (as raw data).

The measurement area is scanned by the measurement light having a long wavelength of 1064 nm ($\lambda_1$) (Step 308). In this case, the data of each measurement point is obtained and the raw data is stored in the RAM 402 shown in FIG. 4. The execution order in Steps 307 and 308 can be reversed.

Next, the data obtained in Steps 307 and 308 and the image data divided the image of the measurement area into RGB images are read from the RAM 402 shown in FIG. 4, and the following processing is performed. In this processing, the following processing is performed for two or more measurement points in the image photographed by the CCD camera 209. For example, the measurement points that are arranged like in a lattice are examined sequentially from the top left in the photographed image. When this measurement point has elements of R and B (or the influence of elements is large), the data of the measurement light of $\lambda_1$ (1064 nm) is selected as the distance data of the measurement point. Moreover, when this measurement point has an element of G (or the influence of the element is large), the data of the measurement light of $\lambda_2$ (532 nm) is selected as the distance data of the measurement point (Step 309).

The distance is calculated based on the selected data after the data is selected in Step 309, and the distances of measurement values in the measurement area are measured (Step 310). Thus, the data group of the distance to the object area is obtained. This data group of the distance is related to the image data photographed in Step 304 and other data, etc., and is stored in the RAM 402. Moreover, the distance information is displayed in display portion 404. If the measurement ends, the processing proceeds from Step 311 to Step 312. Otherwise, the processing after Step 305 is executed again.

According to this processing, when the color of the object (measurement point) on which is emitted the measurement light is R and B, an absorption index of the wavelength of 532 nm is high. As a result, the reflection quantity of the measurement light having $\lambda_2$ (532 nm) is not sufficient. Therefore, the measurement light having $\lambda_1$ (1064 nm) with a greater reflection quantity is selected. Moreover, when the color of the object (measurement point) on which is emitted the measurement light is G, an absorption index of the wavelength of 1064 nm is high. As a result, the reflection quantity of the measurement light having $\lambda_1$ (1064 nm) is not sufficient. Therefore, the measurement light having $\lambda_2$ (532 nm) with a greater reflection quantity is selected. As a result, the measurement light having a wavelength with a greater reflection quantity can be properly selected according to color distribution in the measurement area, and measurement error based on the insufficiency of the reflection quantity is decreased.

Feature of the Third Measurement Action

According to the third measurement action, the problem of the wavelength dependency of reflection strength at the measurement object can be reduced or solved. That is, there is the wavelength dependency of reflectivity by the color and the material of the measurement object. The strength of the reflected light becomes weaker by the combination of the measurement object and the wavelength, and the detection of the reflected light is difficult. However, the reflection condition of the measurement light at the emitted position may be estimated based on the image analysis by using two kinds of wavelength as the measurement light. As a result, the received data with a greater reflection quantity can be used by selecting the data of the reflected measurement light. Therefore, the problem that the strength of the reflected light becomes weaker by the combination of the measurement object and the wavelength, and the problem that the detection of the reflected light is difficult can be reduced or solved.

Fourth Measurement Action

Figure 9:
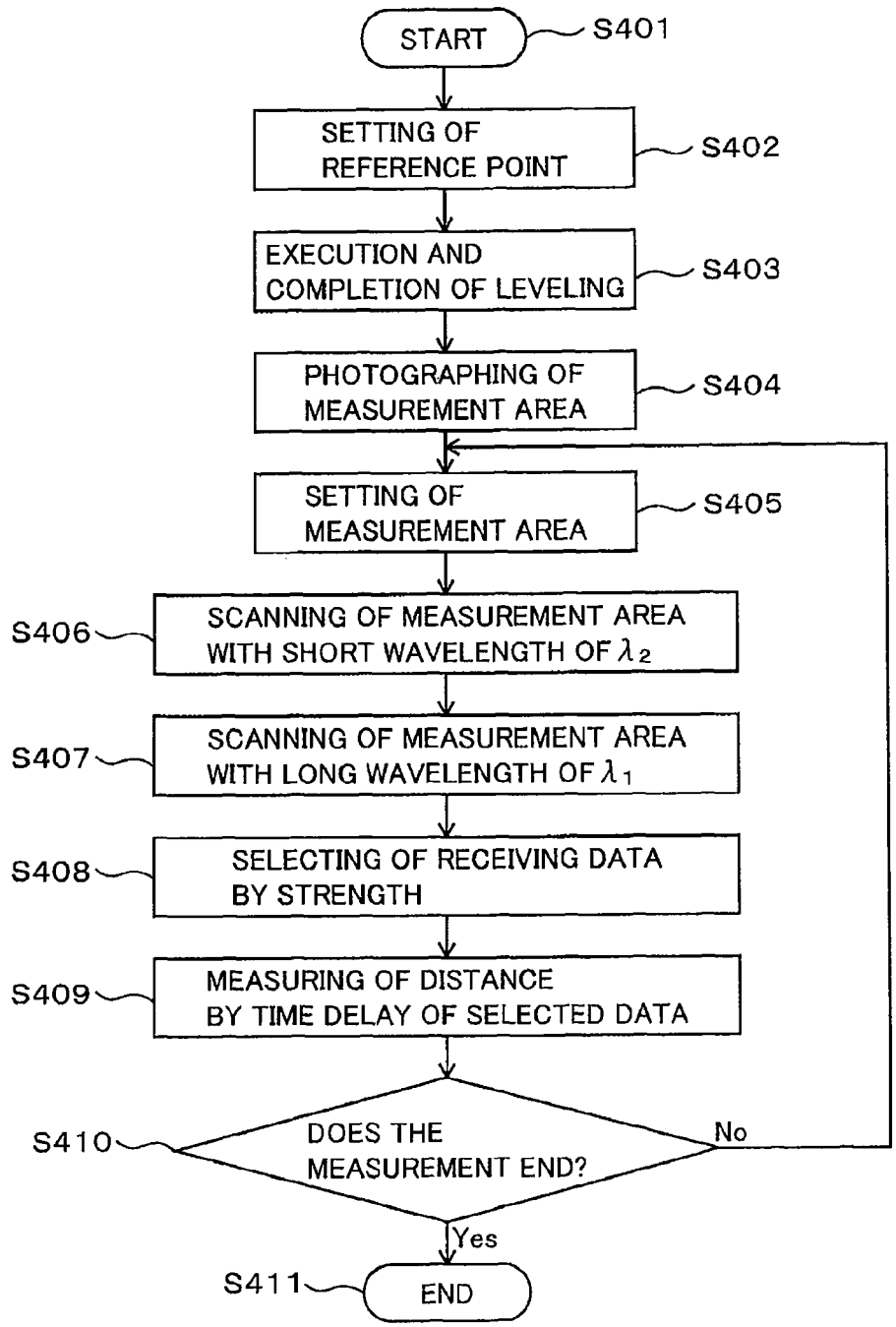
FIG. 9 is a flowchart showing an example of the procedure for measuring a distance.

An example of using the data of the reflected light with high strength when the measurement light having two kinds of wavelengths is emitted to the object is described hereinafter. FIG. 9 is a flowchart showing an example of the procedure for measuring a distance. First, the start processing (Step 401) to Step 405 is the same as Step 301 to Step 305 in FIG. 8.

When the measurement area is set in Step 405, the measurement area is scanned by the measurement light having the short wavelength of 532 nm ($\lambda_2$) (Step 406). In this case, the data of each measurement point is related to the coordinate data of each measurement point and is obtained and is stored in the RAM 402 of FIG. 4. The distance is not calculated at this step. The data of the output timing of the laser pulse from the emission control portion 411 and the data of the receiving timing of the laser pulse from the signal processing portion 412 are stored in the RAM 402 as it is (as raw data). Moreover, the signal processing portion 412 outputs information of the receiving intensity of the reflected light (output level of the light detecting element). This information is related to the data of receiving timing and is stored in the RAM 402.

Next, the measurement area is scanned by the measurement light having a long wavelength of 1064 nm ($\lambda_1$) (Step 407). In this case, the data of sending and receiving timing of each measurement point and the data of the receiving intensity are obtained and the raw data is stored in the RAM 402 of FIG. 4. The execution order in Steps 406 and 407 can be reversed.

Next, the data obtained in Steps 406 and 407 is read out from the RAM 402 of FIG. 4. The receiving strength of the two reflected measurement lights at the same measurement point is compared. The receiving data with higher strength is selected (Step 408). For example, this processing is performed in the comparison judgment portion 421 in FIG. 4. This processing can be performed in the CPU 401.

Next, the distance of each measurement point is calculated by using the selected receiving data (Step 409). The processing in Step 409 is the same as Step 109. Thus, the data group of the distance to the object area is obtained. This data group of the distance is related to the image data photographed in Step 404, other data, etc., and is stored in the RAM 402 of FIG. 4. Moreover, the measured distance information is displayed in the display portion 405 in FIG. 4. If the measurement ends, the processing proceeds from Step 410 to Step 411. Otherwise, the processing after Step 405 is executed again.

According to the fourth measurement action, the receiving data of the reflected light with higher receiving intensity is adopted by using two kinds of wavelength as the measurement light. Therefore, the problem of the measurement error and the inability to take measurements due to the effects of dust and fog, and the problem of weak reflected light based on the color and materials of the object can be reduced or solved.

3. Third Embodiment

Composition of Control System

Next, an example of the apparatus measuring the distance by a method different from that of the second embodiment will be described. The hardware composition of the distance measurement apparatus in this embodiment is basically the same as the distance measurement apparatus in FIG. 3 described in the second embodiment. In this example, two waves of the fundamental wave and the second harmonic wave are emitted to the measurement object at the same time. The measurement light having either wavelength of reflected light is selected based on a predetermined condition at the receiving side, and the distance is measured.

A part that is different from that in the second embodiment will be described hereinafter. The difference between this embodiment and the second embodiment is the composition and the action (a method for processing data) in the signal processing portion 412 in FIG. 4. In this embodiment, the laser apparatus 10 shown in FIG. 1 is adopted as the measurement light emitting portion 205. In this example, the laser apparatus 10 is used in output mode 3 that outputs the fundamental wave and the second harmonic wave at the same time.

Figure 10:
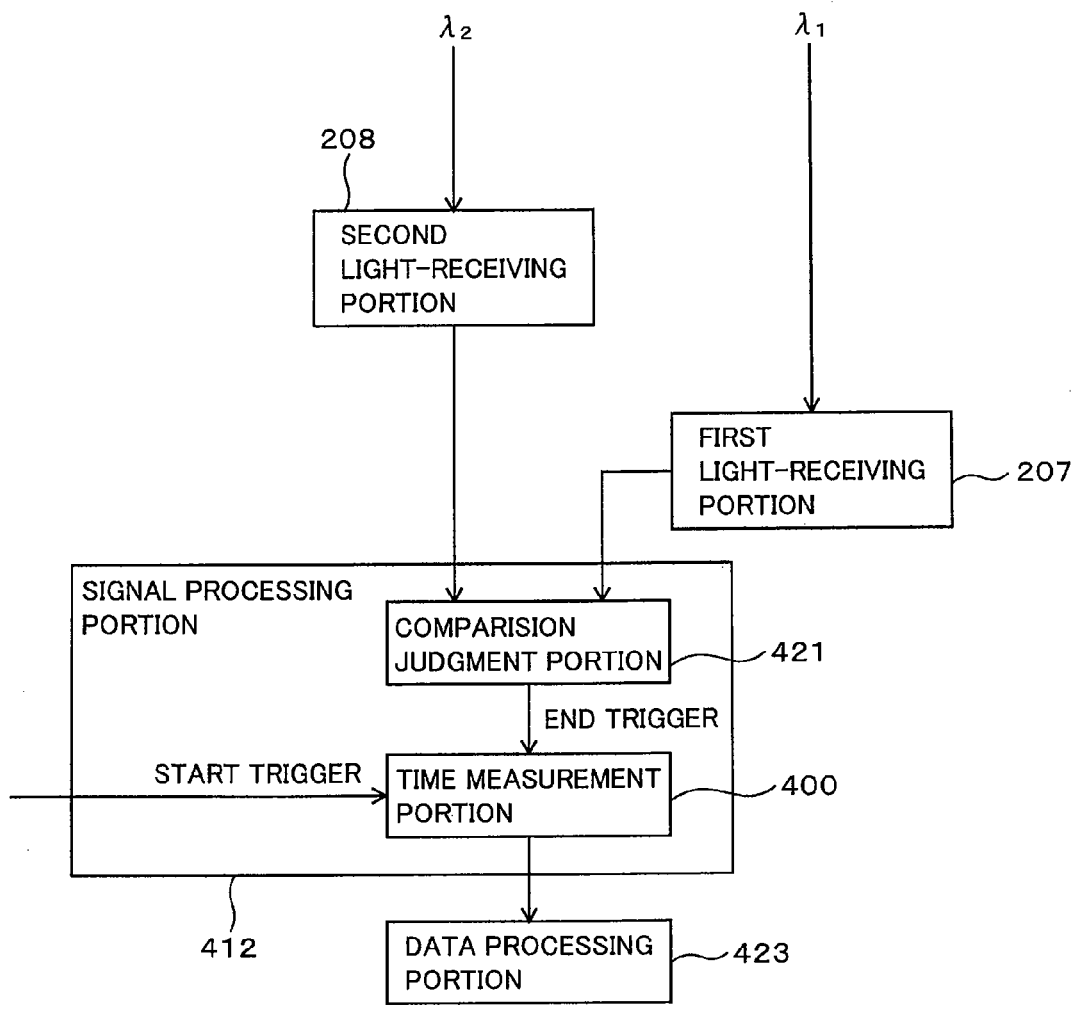
FIG. 10 is a schematic view showing another example of a signal processing portion.

FIG. 10 is a block diagram showing the composition of the signal processing portion 412. In FIG. 10, the laser light having the wavelength of 1064 nm ($\lambda_1$) (fundamental wave) enters into the first light-receiving portion, and the laser light having a wavelength of 532 nm ($\lambda_2$) (second harmonic wave) enters into the second light-receiving portion. The pulse signals from the first light-receiving portion and the second light-receiving portion are amplified with the amplifier (omission of the figure), and input into the signal processing portion 412.

The signal processing portion 412 has the comparison judgment portion 421 and a time measurement portion 400. First, the comparison judgment portion 421 samples pulse signals of the first light-receiving portion 207 and the second light-receiving portion 208 based on a predetermined frequency and detects the pulse width. After the pulse signal is detected, the comparison judgment portion 421 judges which wavelength to use for the distance calculation and outputs an end trigger signal to the time measurement portion 400.

Figure 11:
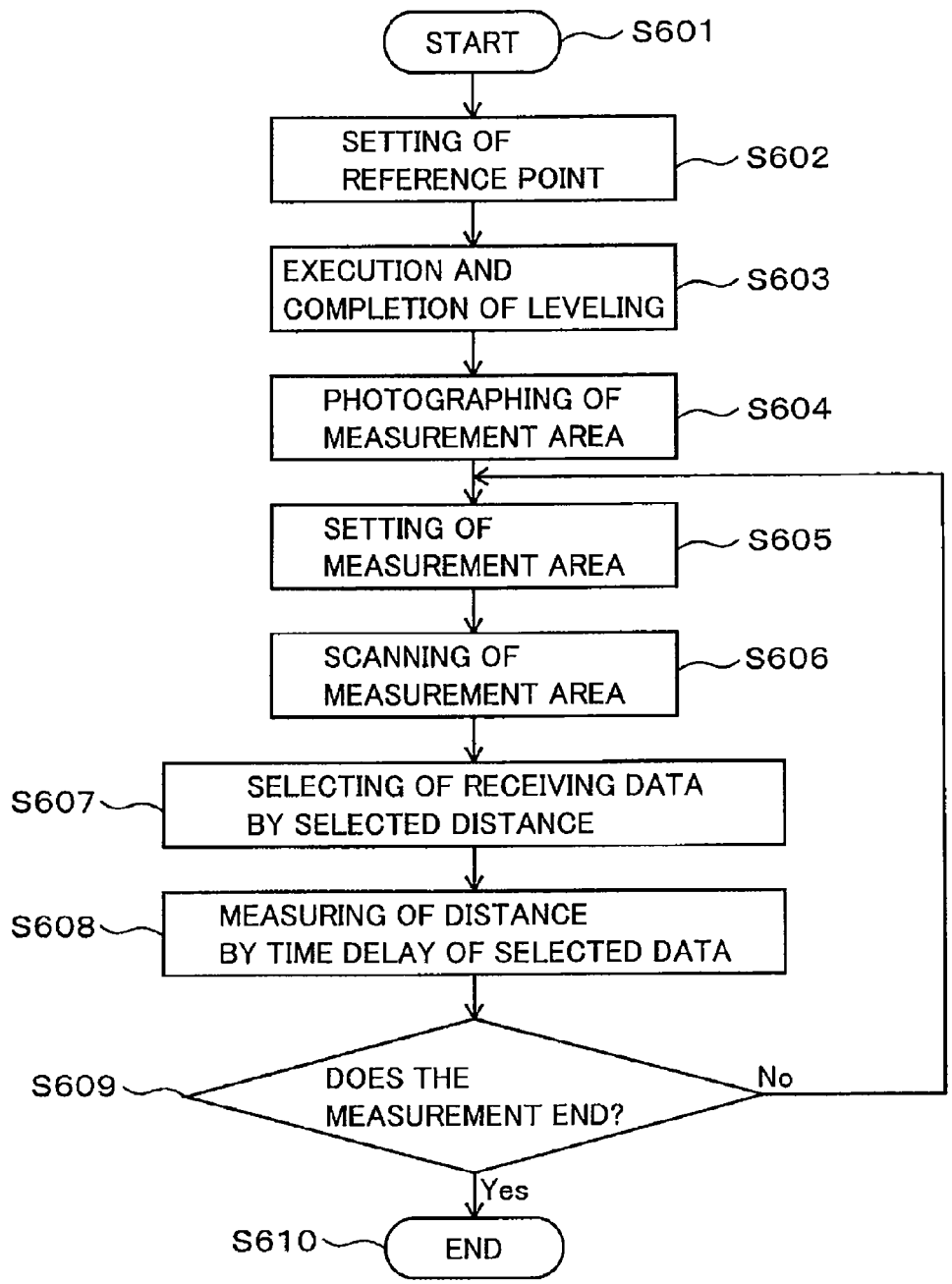
FIG. 11 is a flowchart showing an example of the procedure for measuring a distance.

When the measurement light emitting portion 205 emits the laser light, the time measurement portion 400 inputs a start trigger signal and begins to count the time beforehand. Moreover, the time measurement portion 400 stops counting the time by the end trigger signal from the comparison judgment portion 421. The time measurement portion 400 stores the stopped count value (flight time of the laser light) into the buffer memory as sequence data. The below-mentioned program (a data processing portion 423) stored in the ROM 403 reads out the sequence data of the flight time of the laser light.
First Measurement Action An example of the action of the distance measurement apparatus 1 in FIG. 3 in this embodiment will be described hereinafter. Here, an example of the action selecting the wavelength of the laser light used for the measurement according to the measurement distance to the object. FIG. 11 is a flowchart showing an example of the procedure for measuring a distance. In this example, the operating portion 414 of the distance measurement apparatus 1 in FIG. 4 has a setup key for setting two kinds of measurement areas of the long distance measurement area and the short distance measurement area manually. Moreover, an action program necessary to execute the following processing is stored in the ROM 403.

When the operating portion 414 is operated and the processing of the distance measurement starts (Step 601), the above-mentioned action program stored in the ROM 403 is read to the RAM 402 and the following action begins. First, the processing for setting the reference point is performed (Step 602). The data of this reference point is related to the distance data of each measurement point in the following processing. Then, final three-dimensional measurement data is obtained. When the distance measurement apparatus 1 is set up on the measurement site, the data of this reference point is input to the distance measurement apparatus 1 manually or by the data transmission from the position-measuring instrument using the GPS satellite.

After Step 602, the execution and completion of the leveling are performed (Step 603). In this processing, the horizontality and direction of the apparatus is adjusted. This processing is automatically performed based on the output of a leveling device and a direction sensor, not shown in the figure. When the processing up to Step 603 ends, the display portion 404 in FIG. 4 displays the end information. Next, the operator of the distance measurement apparatus 1 takes aim at the measurement object by using the sighting device 311, and an approximate direction of the distance measurement apparatus 1 is decided. Then, the operating portion 414 in FIG. 4 is operated, and the CCD camera 209 (refer to FIG. 3) photographs the measurement area (Step 604). Moreover, the measurement area is set based on the photographed image (Step 605).

Moreover, at that time, the operator operates the operating portion 414 and selects a short distance or a long distance of the measurement distance (Step 605). In this case, the operator measures the distance to the object by eye and judges whether the distance to the object is a long distance (about 50 m to 800 m), for which the laser light having a wavelength of 1064 nm is appropriate, or whether it is a short distance (about 1 m to 50 m), for which the laser light having a wavelength of 532 nm is appropriate. The operator sets either of these distances.

In Step 606, the pulse laser light having a long wavelength (fundamental wave of 1064 nm=$\lambda_1$) and the short wavelength (second harmonic wave of 532 nm=$\lambda_2$) is output at the same time, and the measurement area is scanned. That is, the laser apparatus in FIG. 1 having the measurement light emitting portion 205 outputs the pulse laser light having wavelengths of 1064 nm ($\lambda_1$) and 532 nm ($\lambda_2$) at the same time. This pulse laser light is output from the measurement light emitting portion 205 in FIG. 4 and is reflected to the upper side in FIG. 4 by the oblique reflection mirror 210 and is emitted to the measurement area via the collecting lens 202 and the rotating reflecting mirror 302.

In this case, the laser light is emitted to each measurement point (each object) while scanning one by one two or more measurement points that are set to the measurement area. For example, m×n pieces (m and n are natural numbers not containing 0) of measurement points are set to the measurement area like a lattice. At least two or more pulses of laser light are emitted to each measurement point. Moreover, the horizontal angle in the rotating optical portion 3 and the elevation angle of the rotating reflecting mirror 302 are controlled corresponding to this pulsed oscillation.

The laser light is reflected by the object of the measurement area in Step 606. The selection reflection mirror 203 shown in FIG. 3 divides the reflected light returning to the distance measurement apparatus 1 according to the wavelength. The first light-receiving portion 207 and the second light-receiving portion 208 receive the divided light. That is, the first light-receiving portion 207 receives the reflected light having a wavelength of 1064 nm ($\lambda_1$). Moreover, the second light-receiving portion 208 receives the reflected light having a wavelength of 532 nm ($\lambda_2$).

In Step 607, the comparison judgment portion 421 reads the setting content in Step 605 of the distance to the object. In the case of the long distance, after the pulse output (1064 nm=$\lambda_2$) from the first light-receiving portion 207 is detected, the comparison judgment portion 421 outputs the end trigger signal to the time measurement portion 400. In the case of the short distance, after the pulse output (532 nm=$\lambda_2$) from the second light-receiving portion 208 is detected, the comparison judgment portion 421 outputs the end trigger signal to the time measurement portion 400.

The time measurement portion 400 inputting the end trigger signal stores the flight time of the laser light in the buffer memory, synchronizing with the emission timing of the laser light in Step 606. The time measurement portion 400 initializes the count and inputs again the start trigger signal from the measurement light emitting portion 205 and begins to count time. This time measurement processing is executed repeating each measurement point like a lattice in the measurement area in Step 605.

Then, the data processing portion 423 in FIG. 10 reads the sequence data of the flight time of the laser light to the RAM 402 from the buffer memory in the time measurement portion 400 in FIG. 4. The data processing portion 423 multiplies this flight time by the speed of light and measures the distance to the object (Step 608). In the processing up to Step 608, the data processing portion 423 generates three-dimensional point group data of the measurement area according to the reference point. The three-dimensional point group data is related to the image data of the measurement area photographed in Step 604 and is stored in the RAM 402. Moreover, the measured distance information is displayed in the display portion 404 in FIG. 4. If the measurement ends, the processing proceeds from Step 609 to Step 610 and ends. Otherwise, the processing returns to Step 605, and the processing after Step 605 is executed again.

Second Measurement Action

Figure 12:
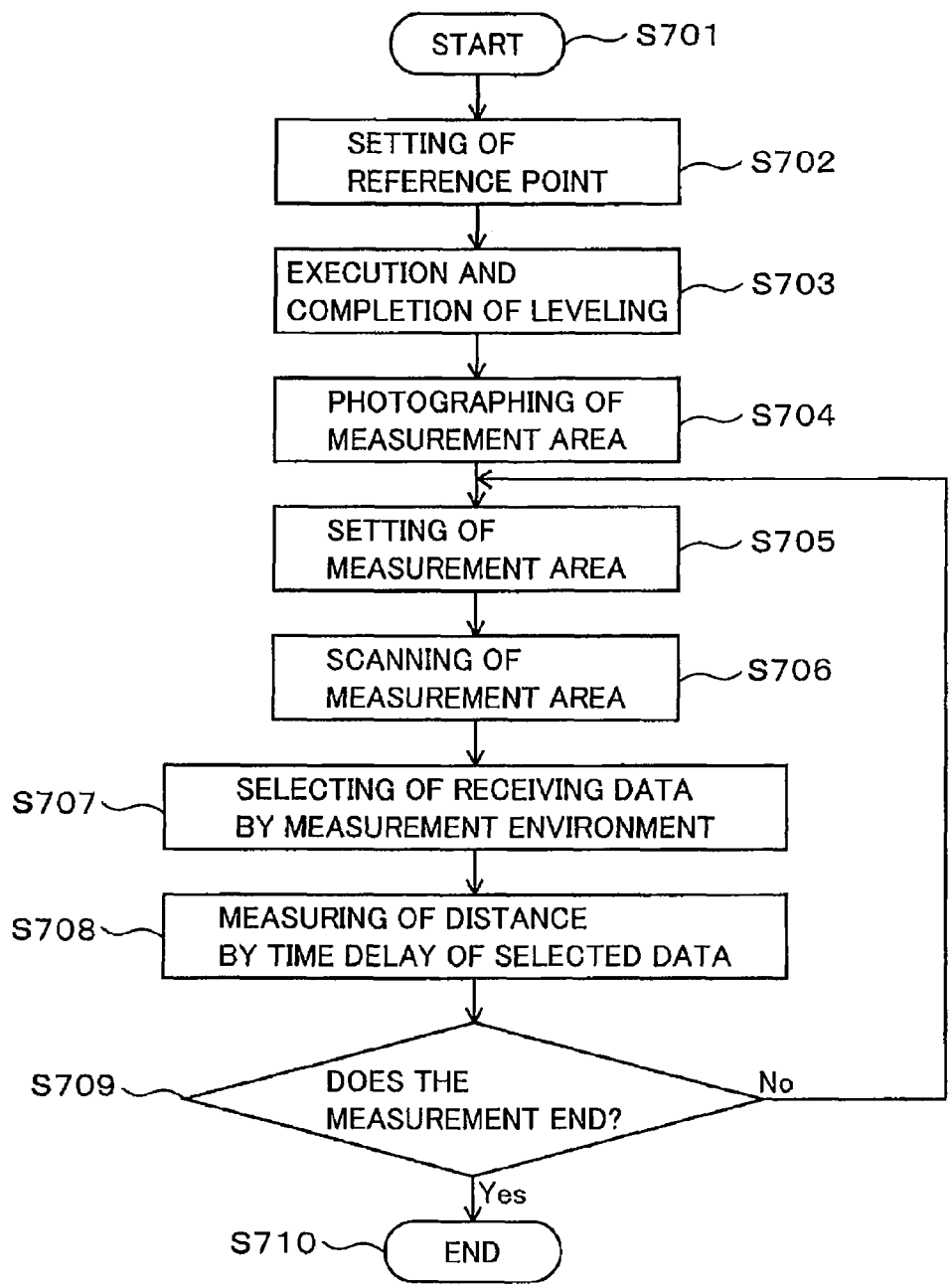
FIG. 12 is a flowchart showing an example of the procedure for measuring a distance.

An example of the action selecting the wavelength of the laser light according to the transparency degree of air in the measurement environment will be described hereinafter. FIG. 12 is a flowchart showing an example of the procedure for measuring a distance. The start processing (Step 701) to Step 704 is the same as Step 601 to Step 604 in FIG. 11. After Step 704, the measurement area is set (Step 705).

In Step 705, the operator selects the transparency degree of air in the measurement environment by operating the operating portion 414 manually. For example, the operating portion 414 can select the transparency degree of air of two kinds: "good" and "inferior". When the measurement environment is a high moisture environment having fog or in a tunnel under the ground and a smoggy environment having large amounts of dusts, the transparency degree of air is set to "inferior". As a result, the pulse laser light having a wavelength of 1064 nm, which can obtain higher output strength than the pulse laser light having a wavelength of 532 nm, can be used for the distance measurement.

The image processing portion 413 can analyze the image photographed in Step 704 and can automatically calculate the transparency degree of air in the measurement environment. The threshold of the transparency degree of air is properly set. Since the processing after Step 706 is the same as the processing after Step 606 in FIG. 11, explanation thereof is omitted here.

Third Measurement Action

Figure 13:
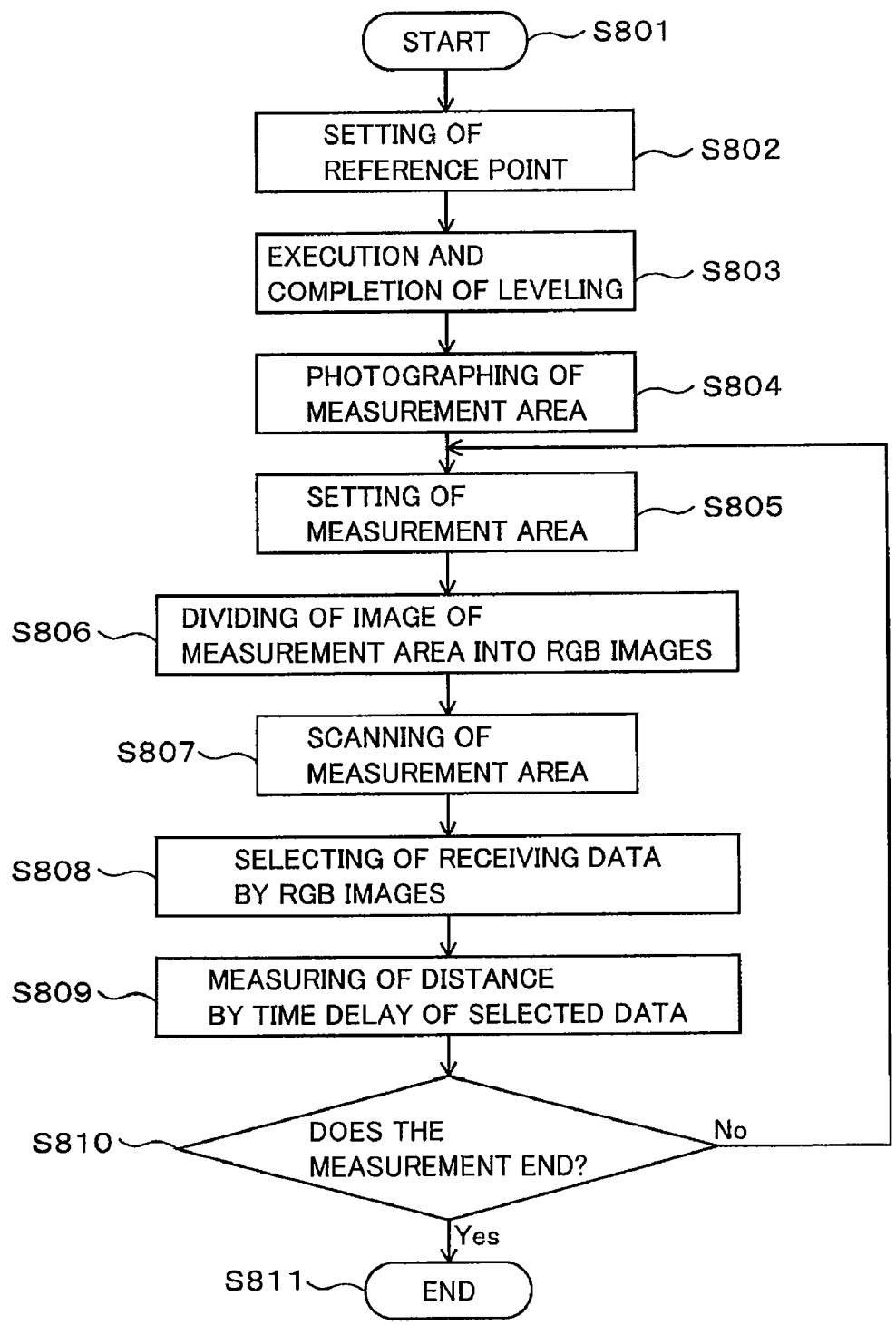
FIG. 13 is a flowchart showing an example of the procedure for measuring a distance.

Here, an example of the action selecting a wavelength of the laser light according to the color of the measurement object will be described. FIG. 13 is a flowchart showing an example of the procedure for measuring a distance. The start processing (Step 801) to Step 805 is the same as Step 701 to Step 705 in FIG. 12.

After Step 805, the image processing portion 413 processes the image photographed in Step 804. The image processing portion 413 divides the image of the measurement area into three images of the colors RGB (Step 806). These RGB images are stored in the RAM 402. Next, the measurement area is scanned (Step 807). In this case, the time measurement portion 400 in FIG. 10 stores the sequence data of the flight time of the laser light having a wavelength of 1064 nm ($\lambda_1$) and the wavelength of 532 nm ($\lambda_2$) in each measurement point in the buffer memory.

The data processing portion 423 reads RGB images of the measurement area in Step 806 and processes as follows. First, RGB images of the measurement area are sequentially examined from the pixel on the top left. When the color component of R and B of this pixel is strong, the flight time data of the laser light having $\lambda_1$ (1064 nm) is used to calculate the distance of the measurement point. Moreover, when the color component of G of this pixel is strong, the flight time data of the laser light having $\lambda_2$ (532 nm) is used to calculate the distance of the measurement point (Step 808).

After the flight time data is selected in Step 808, the data processing portion 423 multiplies the selected flight time data by the speed of light and determines the distance (Step 809). The processing in these Steps 808 and 809 is performed for each pixel in RGB images. Since the processing after Step 810 is the same as the processing after Step 609 in FIG. 11, explanation thereof is omitted here.

Fourth Measurement Action

Figure 14:
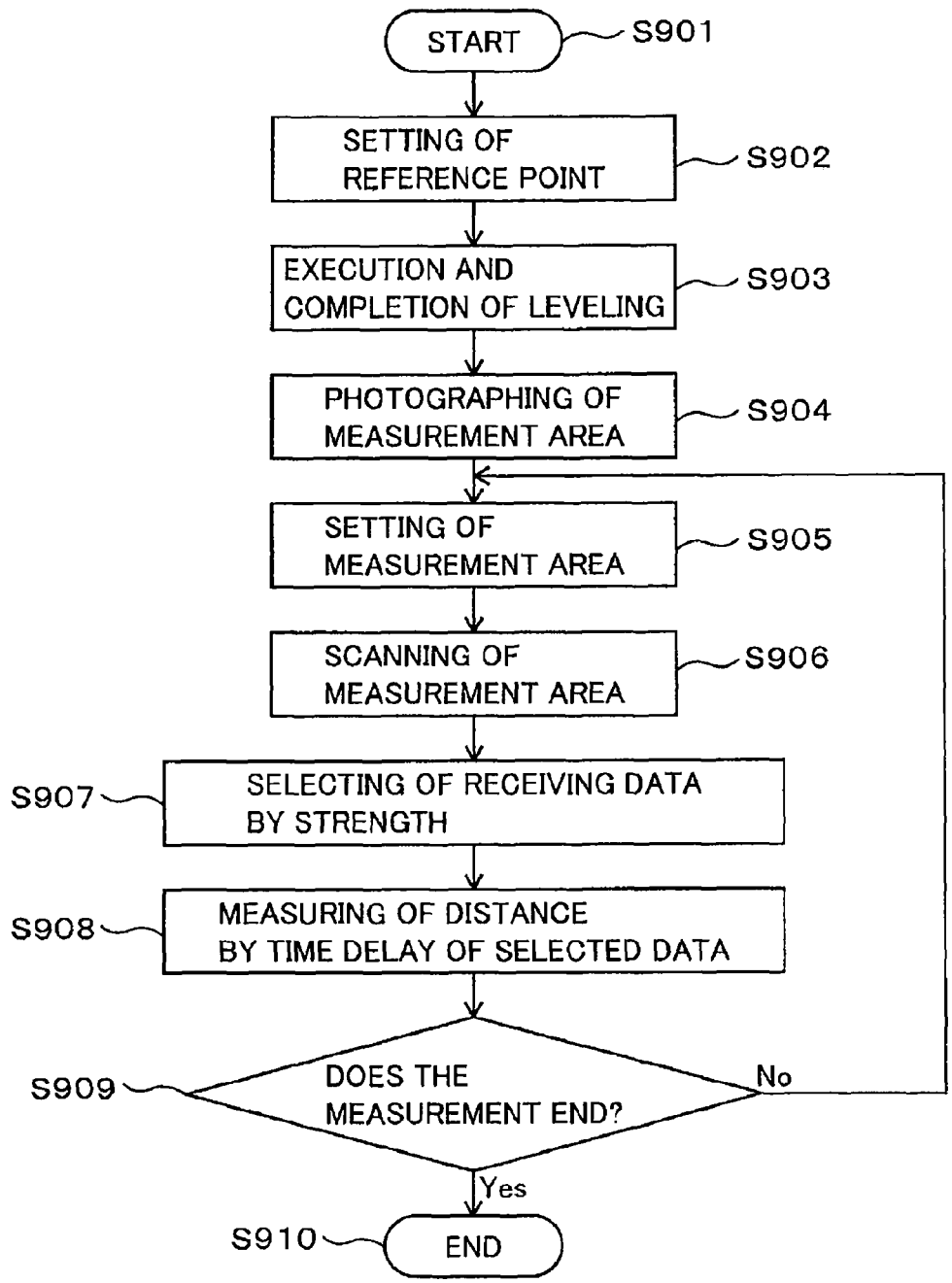
FIG. 14 is a flowchart showing an example of the procedure for measuring a distance.

Here, an example of using the flight time data of the reflected light with high strength of the laser light having two wavelengths emitted to the measurement area will be described. FIG. 14 is a flowchart showing an example of the procedure for measuring a distance. The start processing (Step 901) to Step 905 is the same as Step 801 to Step 805 in FIG. 13.

The laser light having two wavelengths of 1064 nm ($\lambda_1$) and 532 nm ($\lambda_2$) is output simultaneously, and the measurement area is scanned (Step 906). In this case, the comparison judgment portion 421 detects the pulse of two wavelengths and compares the receiving strength of the reflected light having two wavelengths ($\lambda_1$, $\lambda_2$) in the same measurement point. Moreover, the comparison judgment portion 421 selects the flight time data of a wavelength with higher strength and stores it in the buffer memory (Step 907). Since the processing after Step 908 is the same as the processing after Step 608 in FIG. 11, the explanation is omitted.

Other Matters

The invention disclosed in the present specification will be simply described hereinafter. In the present specification, an output light has a first wavelength $\lambda_1$ of relative long wavelength, and a second harmonic wave of the output light has a second wavelength $\lambda_2$ of relative short wavelength, and the $\lambda_1$ is a wavelength band of the infrared light, and the $\lambda_2$ is a wavelength band of visible light.

In the present specification, a laser oscillation portion has a laser medium, and the laser medium is a crystal or a fiber doped neodymium ion or erbium ion. In the present specification, a fundamental wave or a second harmonic wave is selected based on a distance to an object.

In the present specification, the distance measurement apparatus includes a transparency degree detecting portion for detecting a transparency degree of air between the object and the apparatus, and the fundamental wave or the second harmonic wave is selected based on the output of the transparency degree detecting portion. In the present specification, the distance measurement apparatus includes an image photographing portion for photographing an object area including an object, an image processing portion for dividing the photographed image into three images in red, green, and blue and obtaining a color data of the object, and the fundamental wave or the second harmonic wave is selected based on the color data. In the present specification, the fundamental wave or the second harmonic wave is selected based on the receiving strength of light received by the receiving portion.

In the present specification, the distance measurement apparatus includes a selecting portion for selecting relatively long distances or relatively short distances to a measurement area, the signal processing portion selects the output signal of the first light-receiving portion or the output signal of the second light-receiving portion according to the relatively long distances or the relatively short distances to the measurement area and measures a distance to the measurement point in the measurement area. In the present specification, the distance measurement apparatus includes a selecting portion for selecting a transparency degree of air in the measurement area, the signal processing portion selects the output signal of the first light-receiving portion or the output signal of the second light-receiving portion according to the transparency degree of air in the measurement area and measures a distance to the measurement point in the measurement area.

In the present specification, the distance measurement apparatus includes an image photographing portion for photographing a measurement area, and an image processing portion for dividing the photographed image into three images in red, green, and blue, the signal processing portion selects the output signal of the first light-receiving portion or the output signal of the second light-receiving portion according to the color component of the divided images and measures a distance to the measurement point in the measurement area. In the present specification, the signal processing portion selects the output signal of the first light-receiving portion or the output signal of the second light-receiving portion according to the receiving strength of the first light-receiving portion and the second light-receiving portion and measures a distance to the measurement point in the measurement area.

INDUSTRIAL APPLICABILITY

The present invention can be used for a laser apparatus for outputting laser light and can be further used for a distance measurement apparatus for measuring a distance by the laser light.

What is claimed is:

1. A laser apparatus comprising:
   a laser oscillation portion for oscillating laser light as a fundamental wave;
   a nonlinear crystal comprising a periodically poled structure, the nonlinear crystal generating a second harmonic wave of the fundamental wave and outputting the fundamental wave and the second harmonic wave when the oscillating laser light enters the nonlinear crystal;
   a control having a structure that controls a temperature of the nonlinear crystal; and
   wherein the nonlinear crystal generates a maximum amount of the second harmonic wave when the nonlinear crystal is at a predetermined temperature, and a ratio of the fundamental wave and the second harmonic wave output from the nonlinear crystal is controlled by controlling the temperature of the nonlinear crystal with the control.

2. A distance measurement apparatus comprising:
   a laser apparatus comprising:
      a laser oscillation portion for oscillating laser light as a fundamental wave;
      a nonlinear crystal comprising a periodically poled structure, the nonlinear crystal generating a second harmonic wave of the fundamental wave and outputting the fundamental wave and the second harmonic wave when the oscillating laser light enters the nonlinear crystal:
      a control having a structure that controls a temperature of the nonlinear crystal; and
      wherein the nonlinear crystal generates a maximum amount of the second harmonic wave when the nonlinear crystal is at a predetermined temperature, and a ratio of the fundamental wave and the second harmonic wave output from the nonlinear crystal is controlled by controlling the temperature of the nonlinear crystal with the control; and
   an outputting portion for outputting at least one of the fundamental wave and the second harmonic wave output from the nonlinear crystal to an object to be measured;
   a receiving portion for receiving reflection light reflected by the object; and
   a signal processing portion for calculating a distance to the object by an output signal of the receiving portion.

3. The distance measurement apparatus according to claim 2, further comprising a selecting device that selects either the fundamental wave or the second harmonic wave, wherein the outputting portion outputs the fundamental wave or the second harmonic wave selected by the selecting device.

4. The distance measurement apparatus according to claim 2, wherein the outputting portion outputs the fundamental wave and the second harmonic wave at the same time, and the receiving portion comprises: 1) a first receiving portion for receiving reflection light of the fundamental wave reflected off of the object and 2) a second receiving portion for receiving reflection light of the second harmonic wave reflected off of the object, and the signal processing portion selects either a first output signal of the first receiving portion or a second output signal of the second receiving portion in accordance with a predetermined condition and calculates a distance to the object.

* * * * *